(12) United States Patent
Dutta et al.

(10) Patent No.: US 7,663,064 B2
(45) Date of Patent: *Feb. 16, 2010

(54) HIGH-SPEED FLEX PRINTED CIRCUIT AND METHOD OF MANUFACTURING

(75) Inventors: Achyut Kumar Dutta, Sunnyvale, CA (US); Robert Olah, Sunnyvale, CA (US)

(73) Assignee: Banpil Photonics, Inc., Santa Clara, CA (US)

( * ) Notice: Subject to any disclaimer, the term of this patent is extended or adjusted under 35 U.S.C. 154(b) by 383 days.

This patent is subject to a terminal disclaimer.

(21) Appl. No.: 11/162,720

(22) Filed: Sep. 20, 2005

(65) Prior Publication Data

US 2007/0066126 A1    Mar. 22, 2007

Related U.S. Application Data

(60) Provisional application No. 60/522,401, filed on Sep. 25, 2004.

(51) Int. Cl.
*H01R 12/04* (2006.01)
*H05K 1/11* (2006.01)

(52) U.S. Cl. .................... 174/261; 174/255; 29/830

(58) Field of Classification Search ............. 174/255, 174/261; 29/830
See application file for complete search history.

(56) References Cited

U.S. PATENT DOCUMENTS

| 2,800,634 | A | * | 7/1957 | Engelmann et al. | ......... 333/238 |
|---|---|---|---|---|---|
| 5,105,055 | A | * | 4/1992 | Mooney et al. | ............... 174/27 |
| 5,712,607 | A | * | 1/1998 | Dittmer et al. | ............. 333/238 |
| 5,724,012 | A | * | 3/1998 | Teunisse | .................... 333/238 |
| 6,518,864 | B1 | * | 2/2003 | Ito et al. | ..................... 333/238 |

* cited by examiner

*Primary Examiner*—Ishwarbhai B Patel

(57) ABSTRACT

Multilayer high speed flex printed circuit boards (FLEX-PCBs) are disclosed including a dielectrics systems with the back-side trenches, adhesives, signal lines and ground planes, wherein the signal line and ground plane lane are located on the dielectrics. Using of the open trenches in the substrate help to reduce the microwave loss and dielectric constant and thus increasing the signal carrying speed of the interconnects. Thus, according to the present invention, it is possible to provide a simply constructed multiplayer high speed FLEX-PCB using the conventional material and conventional FLEX-PCB manufacturing which facilitates the design of circuits with controlled bandwidth based on the trench opening in the dielectrics, and affords excellent connection reliability. As the effective dielectric constant is reduced, the signal width is required to make wider or the dielectric thickness is required to make thinner keeping fixed characteristics impedance. The fundamental techniques disclosed here can also be used for high-speed packaging.

24 Claims, 12 Drawing Sheets

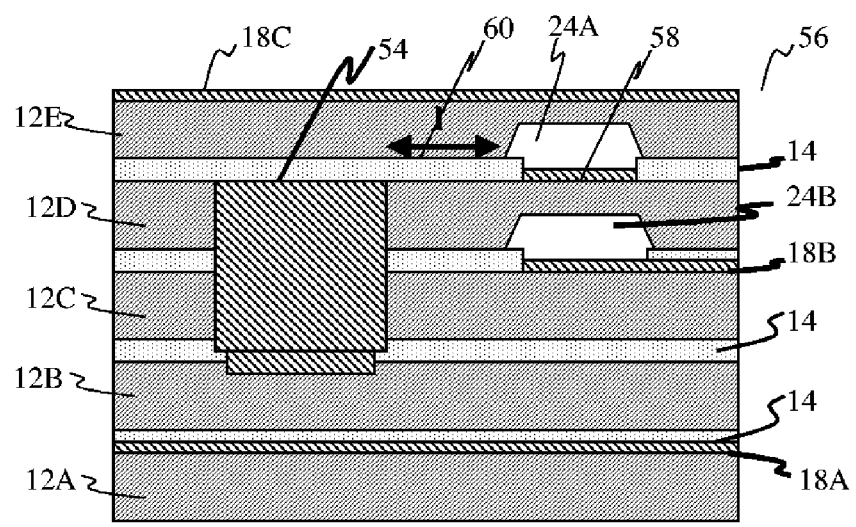
FIG. 9
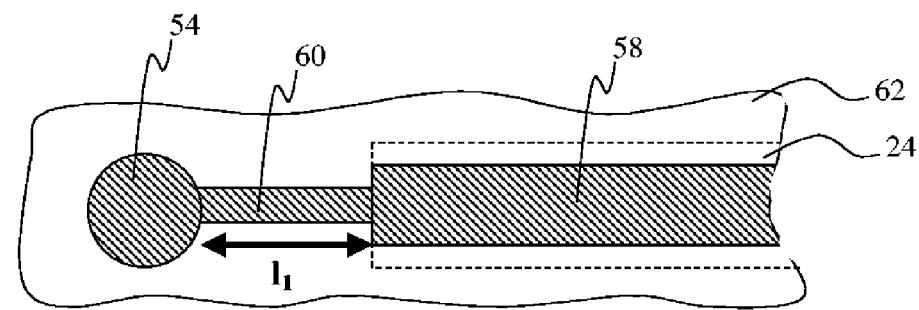
FIG. 10A
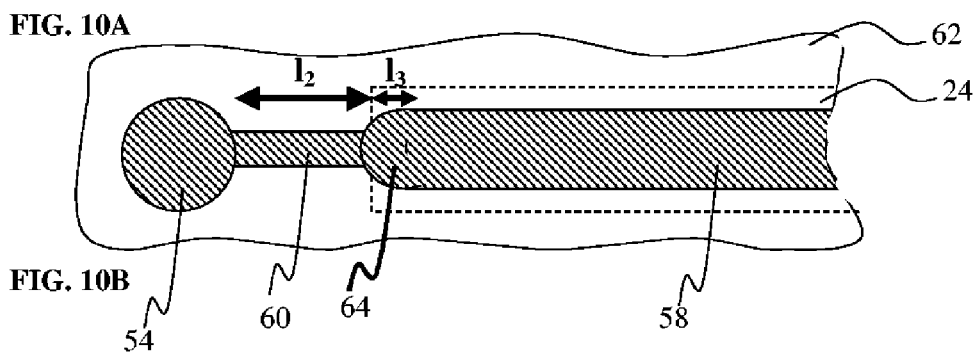
FIG. 10B
FIG. 10

HIGH-SPEED FLEX PRINTED CIRCUIT AND METHOD OF MANUFACTURING

CROSS REFERENCE TO RELATED APPLICATIONS

This application claims the benefit of U.S. Provisional Patent Application No. 60/522,401 filed on Sep. 25, 2004.

FIELD OF THE INVENTION

This invention relates to high speed electrical interconnects for chip-to-chip interconnection, more particularly on the high-speed flex printed circuit board (FLEX-PCB), where two or more integrated circuits (ICs) are needed to connect each others signal lines for communicating. These types of high speed FLEX-PCBs could be in all kinds of computers covering from personnel computer to super-computer, server, storage system, game system, imaging system, and networking systems. This invention is also related to the high-speed electrical interconnection, optical interconnection or both electrical and optical interconnection where FLEX-PCB is used for two or more high-speed electronics and/or optical elements connection.

BACKGROUND OF THE INVENTION

The increasing of higher level of integration within electrical integrated circuit (IC) leads to both higher data rates and larger number of IC interconnections. Today, the inherent signal speed of IC is increased to 3 GHz, and shortly it will be reached to 10 GHz and beyond. The number of pin connection is also increased, with single IC requiring close to 2000 interconnection (i.e. single processor), and shortly it will be increased to over 5000. Simultaneously achieving higher data rates and higher interconnects densities for off-chip, will be increasingly difficult as the IC technologies continue to evolve increasing signal speed of electronic devices and interconnection number. In off-chip case, high density interconnects, covering from die-level packaging to chip-to-chip (hereafter chip indicates the die with package) interconnection on the FLEX-PCB, will also be getting increasingly difficult as the IC technologies continue to evolve increasing the signal speed and interconnection number.

With increasing of the signal speed and interconnection number of the IC, low-cost high-speed interconnect technique compatible to today's manufacturing process are highly desirable to make available in consumer level. Today's FLEX-PCB is mainly made of uniform Polyimide material, and their manufacturing technology along with FLEX-PCB manufacturing are so well matured that, for long run, all system vendors like to use Polyimide based FLEX-PCB to keep the system cost low. However, Polyimide has material characteristics, which limit its usage in high speed if conventional interconnection structure is used. The reason is that conventional Polyimide has the high dielectric loss which mainly limits the bandwidth of interconnects.

FIG. 1 is the schematic showing a part of conventional FLEX-PCB. For simplicity in understanding, only a portion of the FLEX-PCB is shown here. Conventional FLEX-PCB 10 consists of single or multilayer of uniform core layers 12, adhesive used for attaching signal lines and ground to Polyimide 14A and also used for stacking multilayers 14, signal lines 16, and ground 18. The core layer 12 could be any uniform dielectric layer. Usually, Polyimide is used as the core layers in conventional FLEX-PCB. The adhesive 14 is a B-stage (partially cured) acrylic used in between the core layers 12 to stack the multiple core layers. Conventional FLEX-PCB is supplied by vendors as C-staged acrylic (fully cured) adhesive 14A attaching rolled flexible conducting material (usually copper) to the Polyimide core material. The high-speed electrical signal flow through the signal lines 16 attached by adhesive 14 to the core layers 12 and the ground line 18 is laid opposite side of the core layer 12. As shown in FIG. 2, the thickness H, core layer's relative dielectric constant $\in$, metal thickness T, and the width W of the signal lines determine the impedance of the signal line. The signal lines 16 can be the microstripline type signal line 16A or stripline type signal line 16B, as shown in FIG. 2. In conventional FLEX-PCB, the microstrip line type signal line 16A in which the ground 18 is separated by the uniform/homogeneous dielectric (core and adhesive) layer 12 and layer 14. Stripline type signal line 16B is also used in conventional FLEX-PCB, in which the signal line 16B is embedded into the homogeneous dielectric (core and adhesive) layer 12 and layer 14, and both sides the ground 18 is used.

Conventional FLEX-PCB 10 as shown in FIG. 1 is manufactured in the way, the flow chart of which is shown in FIG. 3. This is an explanatory diagram for the prior art of FLEX-PCB manufacturing. The dielectric sheet (not shown) 20 is made using the standard FLEX-PCB technology for example using the slurry casting process. The slurry is cast into about 200 μm to 500 μm thick ceramic sheets by slip cast process. The FLEX-PCB core layer 12 is the homogeneous layer usually used in the conventional FLEX-PCB 10. After the patterning and subsequent etching, the signal line is made on side of the core layers. Microvia and subsequent filling process 24 is done, if necessary. Following this, the sheets 26 are laminated together by hot press to form the FLEX-PCB 28. Density heterogeneities in the laminated samples influence any shrinkage in the sintered substrate. Therefore, this lamination process is homogenously carried out by means of the correct dimensional die and punch with flat surfaces. Burn out and sintering process for the multilayered FLEX-PCB board 10, may be necessary after lamination at the temperature suitable to material used as the sheet. The via hole opening and subsequent metal filling (not shown here) are usually done. A sheet 20 may have more than 10,000 via holes in a in a 50 to 500 μm square area.

In conventional FLEX-PCB 10, as the signal line 16 is either laid on the dielectric material (core layer 12) or embedded into the dielectrics, based on the dissipation factor (tangent loss) of the dielectric material used as the core layer in the FLEX-PCB, the signal experiences dissipation while propagating through the signal line 16. The reason is that the electric field starts from signal line and ends in the ground 18 (not shown) and this electric field passes through the dielectric. This signal dispersion is proportional to the signal frequency, i.e., signal speed. It does mean that the higher the signal speed, the lower the distance of transmission of signal for the fixed dielectric material. In the other words, the higher the speed, the lower the bandwidth of the signal line which is used for connecting one chip to other chip on the board. If the tangent loss of the dielectrics are high, the bandwidth of the interconnects gets so limited that, high speed signal can't be sent over longer distance as compared with the dielectrics having the lower tangent loss.

In addition to tangent loss, the dielectric constant of dielectrics material is also important, as electrical field inside dielectric material having higher dielectric constant experiences more signal delay as compared with that of transmission line comprising with lower dielectric constant material. These causes signal skews for the different length signal lines. In this case also, lower dielectric constant material is necessary in the interconnection for high-speed signal interconnection. This is true for both on-chip and off-chip interconnection. Lower dielectric constant material with low dielectric loss offers following functions; Higher density interconnection is possible due to reduction of the cross talk, (2) reducing the capacitance of the interconnection, helping to transfer the signal longer distance, and (3) lower propagation delay.

Considering signal loss and signal delay for various signal line length it is highly desirable to design the interconnects on FLEX-PCB with effective dielectric constant and effective loss of the interconnect system lower.

It is very straight forward that increasing the bandwidth can be possible using of the material having the lower loss tangent (dielectric loss). However, in this case, for off-chip interconnection new material development is necessary. Besides, manufacturing technology is needed to develop to implement in the product level. Conventionally, to increase the interconnects bandwidth, dielectrics having lower tangent loss is used as the FLEX-PCB layer. This dielectric material is very high cost and the manufacturing process for building FLEX-PCB using these materials are not matured yet. In addition, the FLEX-PCB made of such low loss material has low reliability. It is highly desirable to have high speed FLEX-PCB that can be built up with the conventional well-matured dielectric material (for example Polyimide) and also conventional well-matured fabrication process can be used. This can not only reduce the cost, but also have high reliability.

Much work can be found in off-chip interconnection technology focusing on the material development. As for example, low loss materials like Rogers R/flex 1100, etc. are under development stage, to achieve high bandwidth. Implementing new material in FLEX-PCB fabrication process will cost tremendously to make it mature. In addition, new materials having low tangent loss is a material incompatible with conventional dielectric material such as Polyimide processing so is not a low cost solution. These materials will require a much higher temperature and pressure for lamination. Today, in developing the high speed FLEX-PCB, more focused are being paid on shortening the length or on the interconnection layout. In both cases, implementing technology would need to pay high cost.

As explained above, the conventional FLEX-PCB technology being used for off-chip interconnection cannot be used as the need of the signal speed is increasing. And also exiting conventional electrical interconnects have the limitation of achieving the bandwidth in certain level, beyond that complete manufacturing technology is needed to be changed which is costly for FLEX-PCB industries. It is highly desirable to have lower dielectric constant and lower dielectric loss (loss tangent) by adopt a technique or method which can be easily implemented, and which can use the standard dielectric material FLEX-PCB technology.

SUMMARY OF THE INVENTION

Accordingly, it is an object of the invention to provide the technique to reduce the effective dielectric constant and effective dielectric loss of interconnection system especially dielectric material, to increase the bandwidth of the interconnection for building high speed FLEX-PCB.

Accordingly, it is an object of this invention to use the inhomogeneous dielectric system to reduce the effective dielectric loss and dielectric constant of the dielectric material.

According to the invention it is an object to provide the interconnection structure where large portion of the signal (electromagnetic wave) is allowed to pass through the air or dielectric material having the dielectric loss less than the dielectric material itself on which the signal line is laid out.

It is an object of this invention to provide the manufacturing process of the high-speed FLEX-PCB carrying the high-speed signal lines.

Another object of the present invention is to provide the interconnection structure for inter-chip (off-chip) interconnection on the board, which is compatible to available FLEX-PCB technology.

According to the invention, the high speed FLEX-PCB for off-chip interconnection comprises, (i) single or multiple electrical signal lines for carrying the electrical signal from one electronics elements to another and vice-versa for electrical communication; (ii) single or multiple dielectrics which are in stacked by adhesive wherein the dielectric system carrying the signal lines has structure comprising with back slot or open trenches with deepness and width, and located under the signal line (conductor); (iii) a ground or power line located to opposite side of the dielectrics, wherein the shape of the back-slot or trench could be rectangular or square or circular or any shapes convenient for manufacturing, and covering the width the same, or less or more than the metal conductor carrying the signal.

According to this invention, the signal line of microstrip-line type configuration has one open trenches under the signal lines, and the signal lines of strip-line configuration has the opened trenches located top and bottom of the dielectrics.

According to this invention, it is our object to provide the structure of the opened-trenches under the signal lines of the high speed FLEX-PCB.

According to the invention it is an object to provide the via structure to connect the two or more layers of high speed FLEX-PCB considering both from manufacturing point of view and also from the impedance point of view.

According to this invention, high speed FLEX-PCB process comprises, (i) first single or multiple core layers formation having copper layer in only one side and B-stage acrylic adhesive on side opposite copper; (ii) making the signal lines in single or multiple core layers; (iii) opening the trenches in opposite side of the signal lines, wherein the trench depth is decided from the bandwidth required for the interconnects and the trench width can be selected based on the convenience in manufacturing and the requirement in interconnects bandwidth; (iv) hot press and lamination for stacking the sheets, and; (v) sintering under temperature.

According to this invention, the process for FLEX-PCB having the signal line of microstrip line configuration, comprises, (i) first single or multiple core layers formation having copper layer in only one side and B-stage acrylic adhesive on side opposite copper; (ii) making the signal lines in the first core layer; (iii) opening the trenches in opposite side of the signal lines located on first core layer, wherein the trench depth is decided from the bandwidth required for the interconnects and the trench width can be selected based on the convenience in manufacturing and the requirement in interconnects bandwidth; (iv) second core layer formation having copper layer in only one side of the core layer; (v) hot press and lamination for stacking the first core layer, adhesive layer, and second core layer with uniform copper layer, and; (vi) sintering under temperature.

According to this invention, the process for FLEX-PCB having the signal line of strip line type configuration, comprises, (i) first core layer formation having uniform copper layer in only one side and B-stage acrylic adhesive on side opposite copper; (ii) making the signal lines in the first core layer; (iii) opening the trenches in opposite side of the signal lines located on first core layer, wherein the trench depth is decided from the bandwidth required for the interconnects and the trench width can be selected based on the convenience in manufacturing and the requirement in interconnects bandwidth; (iv) second core layer formation having uniform copper layer in only one side and B-stage acrylic adhesive on side opposite copper; (v) opening the trenches in opposite side of the uniform copper layer (of second core layer), wherein each trench's position is the same as that of the trenches made in the first core layer and the trench depth is decided from the bandwidth required for the interconnects and the trench width can be selected based on the convenience in manufacturing and the requirement in interconnects bandwidth; (vi) third core layer formation having uniform copper layer in only one side of the core layer; (vii) hot press and lamination for stacking the second core layer with trenches, adhesive, first core layer, adhesive layer, and third core layer, and; (viii) sintering under temperature.

According to this invention, the electrical signal line could be microstrip type or strip line type or coplanar type waveguide.

According to the invention, the dielectric material having lower dielectric loss than the dielectric material on which the signal line is drawn can fill the trench or back-slot of the dielectric system.

According to the invention, the trench or back-slot of the dielectric system can be filled with air or kept in vacuum.

According to the invention, the trench or back-slot of the dielectric system can be filled by the liquid crystal material, which can tune the dielectric constant and loss.

According to this invention, the opened trench can be filled with the coolant to cool the FLEX-PCB.

According to this invention, the high speed communication can be possible between two or among more than two electrical (or optical) elements where electrical, optical or both electrical and optical signal are used for transmission through the interconnects.

According to this invention, the effective loss tangent and effective dielectric constant of the dielectric system is reduced, which reduce the microwave-loss and makes to increase the interconnects bandwidth for high speed electrical signal propagation, and also reduce the signal propagation delay. The lower the microwave loss to zero, the closer to be the electromagnetic wave to the speed of the light.

The invention offers to fabricate the high speed FLEX-PCB (which can be used to connect the signal lines of two or more IC among each other to communicate without sacrificing each inherent signal speed. The high speed FLEX-PCB embedding with the high speed interconnects can be easily fabricated using conventional FLEX-PCB manufacturing technology. The methods described in this disclosure enables to make the electronics interconnects for inter-chip connection in cost-effective manner and suitable for practical application.

The other object of this invention is to minimize the skew in the signal interconnection, occurred due to the signal propagation delay, by reducing the microwave loss.

Other objects, features, and advantages of the present invention will be apparent from the accompanying drawings and from the detailed description that follows below.

BRIEF DESCRIPTION OF THE DRAWINGS

The invention will be explained in more detail in conjunction with the appended drawings wherein.

FIG. 9 is the schematics illustrating the structure of the via structure used in the high speed FLEX-PCB, in according to this invention;

FIGS. 10A and 10B are the schematics illustrating the top view of the signal lines on the high speed FLEX-PCB, in according to this invention; The transition of signal lines layout is shown, which is considered from manufacturing point of view and also keeping the impedance constant along the signal line to Via.

DESCRIPTION OF THE PREFERRED EMBODIMENTS

Figure 1:
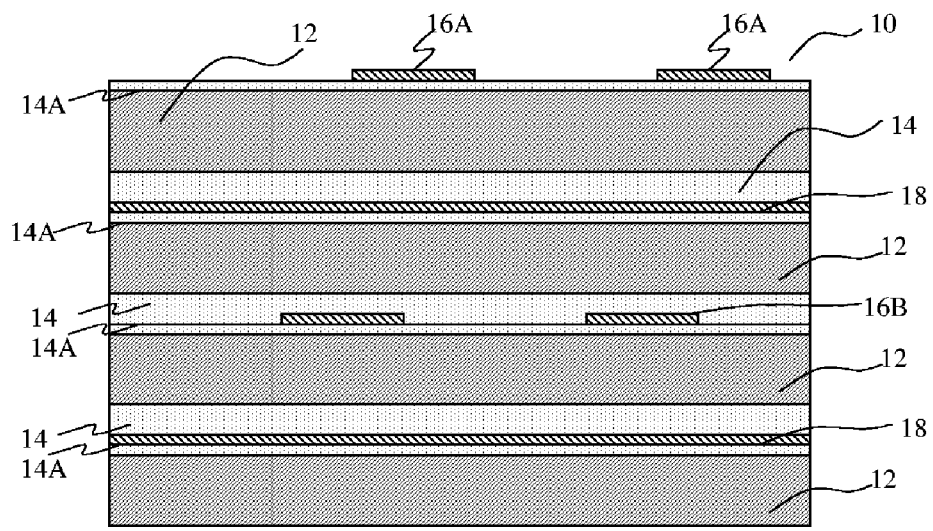
FIG. 1 is the cross-sectional view showing the prior art of the FLEX-PCB used for electrical connection of ICs intra-chips. For simplicity, enlarged view of a multilayerd FLEX-PCB is shown.

The best modes for carrying out the present invention will be described in turn with reference to the accompanying drawings. In the following description, the same reference numerals denote components having substantially the same functions and arrangements, and duplicate explanation will be made only where necessary.

An important point of high speed FLEX-PCB having high speed electrical interconnects is that the microwave loss is to be reduced by reducing the effective dielectric constant, resulting in increasing the bandwidth of the interconnects and keeping the signal-speed of the interconnection system closer to the source speed. Other point is also kept in mind that the technique is to be cost effective, and compatible to standard manufacturing technology can be used.

In interconnects system for two or more electronics elements (two or more ICs etc.) Connections, the signal can be conveyed electrically through the wire (electrical conductor) laid on the dielectric medium. For high speed signal transmission electrical conductor is to be transmission line of type microstrip or strip line. The signal speed in the interconnects (i.e. bandwidth of the interconnects system) is mainly dominated by; (a) signal conductor parameters (i) length and (ii) thickness, and (b) dielectric material properties (i) dielectric constant, and (ii) loss tangent. Longer interconnect length will increase the capacitance by $A \in L/d$, where A is the area of the signal conductor, $\in$ the dielectric constant of the material, and d the thickness of dielectric material. With optimized design, capacitance is mostly limited by the dielectric constant. As frequency increases the signal is started to attenuate due to the skin effect. For example Cu at 100 GHz, the skin-depth $(\delta)=0.2$ μm. For comparatively lower frequency, this skin-depth can be neglected. Therefore, bandwidth of the interconnect system is mainly dominated by the dielectric material properties such as dielectric constant and loss tangent. For increasing the bandwidth of the interconnects, their values should be low.

It is very straight forward that increasing interconnects bandwidth can be possible by using of the low dielectric loss material in off-chip interconnects. However, new materials are needed and manufacturing technologies are to be developed to implement new material into high speed FLEX-PCB fabrication.

It is highly desirable to have the high speed FLEX-PCB, the interconnect embedded into it should have the low effective dielectric loss and dielectric constant and such high speed FLEX-PCB can be fabricated using conventional manufacturing technology.

In the preferred embodiments explanation, first the structure of the high speed FLEX-PCB along with the techniques to reduce the effective dielectric constant and dielectric loss, according to this invention will be explained, and later part of this section covers the fabrication process and some design estimations based on conventional material such as Polyimide dielectrics as the examples, related to the preferred embodiments.

Figure 4:
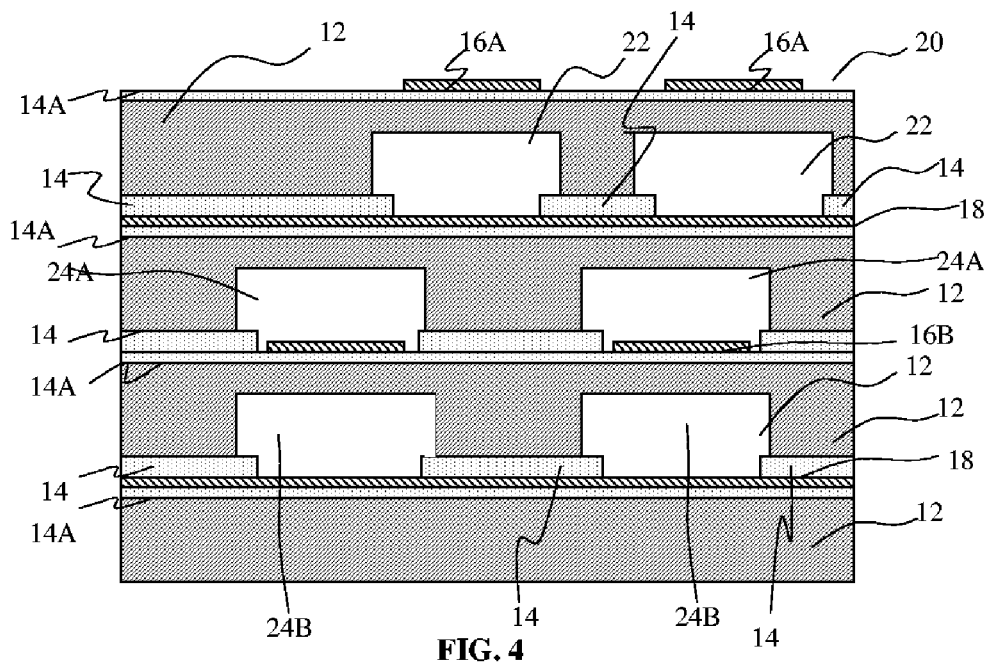
FIG. 4 is the cross-sectional view showing the high speed FLEX-PCB used for off-chip interconnects according to the inventions. For simplicity, enlarged view of a multiplayer FLEX-PCB is shown.

(a) High-Speed FLEX-PCB Structure:

FIG. 4 is the cross-sectional views of the portion of the high speed FLEX-PCB, in accordance to the present invention, wherein like parts are indicated by like reference numerals as used previously, so that repeated explanation is omitted here. The high speed FLEX-PCB 20 as shown in FIG. 4 consists of the four layers of cores 12 and adhesive 14A on which two layers are for the signal lines 16A and 16B, and two layers for the ground (that could be used as the power or ground) 18. These four core layers with signal lines and ground are stacked together to form the multilayered-FLEX-PCB 20 by using two layers adhesive 14 in between of two layers of the cores. The signal lines 16A is microstrip type and signal lines 16B are in stripline type signal lines. According to this invention, in high speed FLEX-PCB 20, the signal lines 16A and 16B has lower dielectric loss and lower dielectric constant, since the trenches 22 and 24 are opened under the signal lines. The signal line 16A of microstrip type has one trench of 22 under the signal and the signal line 16B of stripline type has the two openings, one 24A is in the top layer and other in the bottom layer 24B. According to this invention, the effective dielectric loss (loss tangent of dielectric system) can be reduced and the signal attenuation while propagating can be reduced. In other words, signal transmission is less dispersive, and higher bandwidth of the interconnects system is ascertained, as compared with the conventional FLEX-PCB where signal conductor is laid onto the uniform dielectric medium, as shown in FIG. 1 as an example of the prior art. Less cross talk is also expected as the effective capacitance is also decreased. Based on the design, the significant of the electromagnetic wave can be made to pass through the open-trench 22 or 24. The width of the trench can be adjusted based on the signal line width. The signal line impedance can be designed by designing the trench, dielectric layer thickness, and the signal line width. According to this invention, the opened trenches can be filled with the air or dielectric material (not shown) having lower dielectric loss than the dielectric material 12.

Figure 5A:
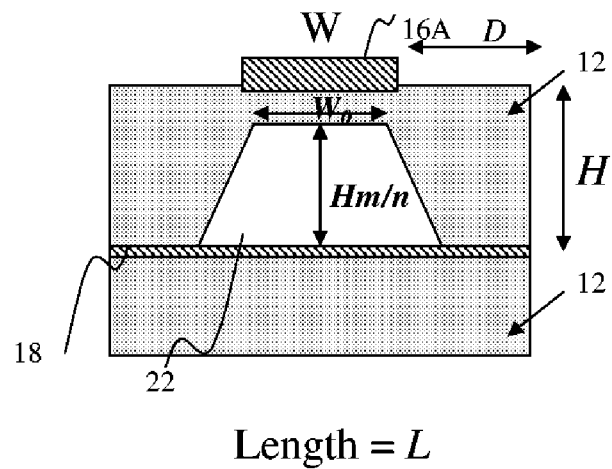
FIGS. 5A and 5B are the cross-sectional views' showing the electrical signal lines embedded into the high speed FLEX-PCB for off-chip connection in t according to this invention.
Figure 5B:
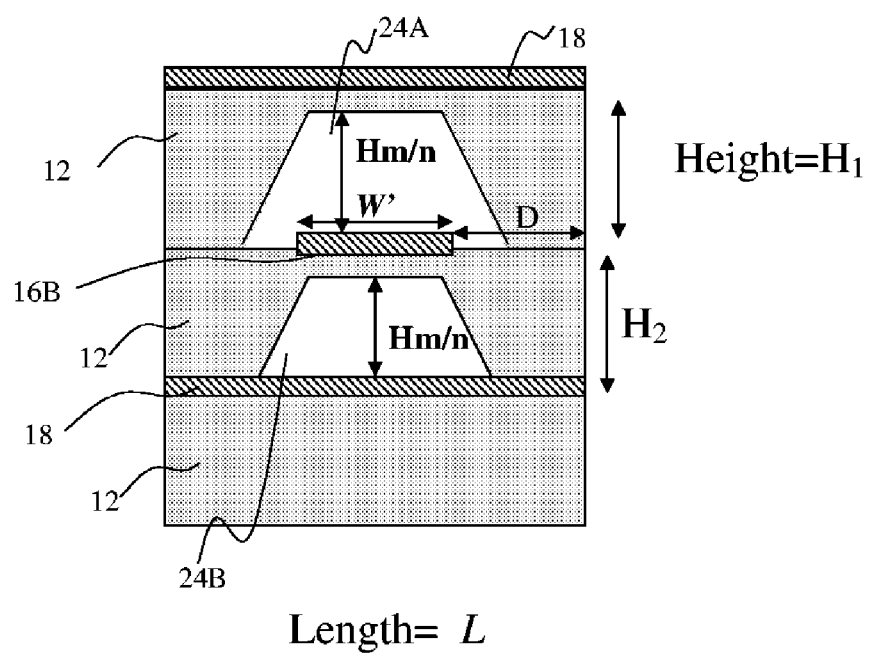

FIGS. 5A and 5B are the cross-sectional views of the portion of the signal lines of microstrip type and stripline type configurations, respectively, in accordance to the present invention, wherein like parts are indicated by like reference numerals as used in FIG. 4, so that repeated explanation is omitted here. In FIG. 5A, the signal lines 16A is microstrip type signal line and it consists of two layers of the core layers 12, in which the top layers 12 has the signal lines 16A and opened trench 22 under the signal lines and the bottom dielectric layer (core) 12 has the uniform metal layer 18 which acts as the ground in the microstrip type signal line 16A. In FIG. 5B, the signal lines 16B are the stripline type signal line and it consists of three layers of the cores 12, in which the top layers 12 has the ground 18 with opened trenches 24A, middle layer 12 has the signal lines 16B with opened trench 24B aligned along with signal lines 16B, and the bottom core layer 12 with the ground metal layer 18. These three layers are stacked together to form the stripline type signal lines. According to this invention the effective dielectric loss and dielectric constant (i.e. microwave index) are considerably decreased as mentioned in earlier. The explanation for getting the high bandwidth is already explained in FIG. 4, so that related explanation is omitted here.

According to the invention, based on the interconnect structure design, the effective dielectric loss and effective dielectric constant of the interconnect system can be controlled. This helps to add many features in the interconnection such as varying the phase velocity (which is function of the dielectric constant), varying the bandwidth of the interconnect; help to adjust the skews of the signal etc. in the single interconnect system. According to the preferred embodiment, ideally, the speed of the signal in the signal line can be made to speed of the light in the air, if other loss due to the signal line structure such as the electrode parameter (resistance, capacitance) are neglected. The bandwidth of the electronic interconnect system can be possible to make the closer or greater than optical fiber (closer to the light). In the example, the dielectric system consisting of the opened (backside)-trench or backside slot is considered. This invention covers all high-speed FLEX-PCB in which embedded signal lines as mentioned earlier are used, which is used for off-chip interconnects.

According to this invention, the high speed FLEX-PCB can be designed using single or plurality of dielectric layer(s) with backside opened-trench or slot under the high-speed signal line. For simplicity, we have shown the four layered-FLEX-PCB with having two signal lines layers and two ground layers. However this present invention also includes all high speed FLEX-PCB having single or multiple layered FLEX-PCB having the trench or slot under the signal line to increase the bandwidth of the interconnection system.

According to the present invention, it is our object to control the propagation of the electrical field significantly inside the trench or slot (by filling with the air or low loss (and/or dielectric constant) material which thereby increasing the bandwidth of the interconnection system and reduce the signal propagation delay. In the preferred embodiments, as explained above from FIG. 4 and FIG. 5, the strip-line and microstrip line configuration with single or two signal lines are shown in the object of explaining the inventions. These inventions also cover other single or multiple signal lines in other configuration such as coplanar-line configurations. Signal lines could be single or differential line.

In the preferred embodiments, the dielectric layer is mentioned in an object to cover all dielectric materials, which show the dielectric properties. The dielectric materials include all kinds of ceramic materials such as Duroid, AlN, $Al_2O_3$, Mullite ($3Al_2O_3$: $2SiO_2$), SiC, $SiO_2$, Silcon nitride, silicon carbide, Silicon-Oxy-Nitride, BeO, Cordie-rite (magnesium alumina silicate), BN, Glass (with different compositions), polyimide, epoxy-glass, FR4, CaO, MnO, ZrO2, PbO, alkali-halide (e.g. NaBr, NaCl) etc.) BN, BeO, and all kinds of low temperature cofired ceramics etc., and all kinds of the polyimides and benzocyclobutenes (BCBs) having dielectric properties. All kinds of polymer materials having dielectric properties falls also under this dielectric material. These dielectric materials can be made using high temperature ceramics processing or using the IC fabrication process. Polymer dielectric material also includes, but not limited to, Teflon, liquid crystal polymer, epoxy, parylene, silicone-polyimide, silicone-gel, and fluorinated ethylene propylene copolymer. It also includes materials of elastomers (e.g. silicone elastomer), monomers, and gels. Dielectric materials, which can be made using high temperature ceramics processing or using the IC fabrication process, also include this category. All standard polymers can be available from the standard manufacturer for example, Du-pont, Hitachi-Chemical, Mitsui, and Mitsubishi-Chemical Industries. Gore-Tex, Japan, markets liquid crystal polymer.

In the preferred embodiments as explained FIGS. 4 and 5, dielectric systems having backside-opened-trench into the dielectric layer are considered. The opened trench could be filled up with any dielectric material having lower dielectric loss and/or lower dielectric constant than the dielectric core layer. Alternatively, the lower dielectric constant material can be air or vacuum. Alternatively, in the preferred embodiment, trench or slot can be filled up fully by the liquid crystal material or coated by liquid crystal. The electrical field can change the orientation of the liquid crystal and can have the control of the effective dielectric constant and dielectric loss of the dielectric system. This could also provide the tunability of the effective dielectric constant and the loss of the dielectric system.

According to the present invention, the high speed FLEX-PCB is made using the dielectric system, which has lower effective dielectric loss and dielectric constant. The preferred embodiments can be applied in many applications in different ways and forms. For examples, preferred embodiments mainly can be used for high speed FLEX-PCB where interconnects for connecting high-speed multiple (two or more) ICs. The application includes, but not limited to, (a) off-chip interconnects for example, connecting two or more electronics chips on the board, (b) high speed chip (die) packaging, and (c) high speed electrical multichannel ribbon type flex printed circuit for connecting multiple electrical modules for example board-to-board interconnection, rack-to-rack interconnection, etc.

In the preferred embodiments as explained below, high speed FLEX-PCB process is explained in an object of showing its manufacturability using the conventional manufacturing process. (of the techniques to reduce the microwave loss and dielectric constant to increase the bandwidth and to reduce the signal propagation delay), but not limited to, the specific description provided. The design estimation is also included in an object to show the reduction of the effective dielectric constant and effective dielectric loss factor, and the significant improvement of interconnects bandwidth. It is also noted here that based on the dielectrics removal, the bandwidth of the interconnects embedded into the high speed FLEX-PCB can also be adjusted.

(b) High-Speed FLEX-PCB Process and Design

Before going to explain the fabrication process of the multilayered high speed FLEX-PCB with embedding the high speed signal lines mentioned above, we will explain the process for the two main signal lines which are microstrip type signal lines and strip line type signal lines. The multilayered high speed FLEX-PCB may have single or multiple layers of such signal lines embedded into the FLEX-PCB.

(i) Fabrication Process for Microstrip Line Type Signal Lines

FIGS. 6A, 6B, 6C, and 6D are process steps for building the high speed FLEX-PCB with microstrip type signal lines in accordance to the present invention, wherein like parts are indicated by like reference numerals, so that repeated explanation is omitted here. Enlarged cross-sectional views of a portion of high speed FLEX-PCB are only shown for explanation. In the preferred embodiment, the process for the high speed FLEX-PCB having only microstrip lines type signal lines consists of signal lines 16A formation from uniform metal layer 25 of the sheet material 26, opening the trenches 22 under the signal lines 16A, stacking with other sheet material 28 having one side uniform metal layer which acts as the ground 18. The stacking can be performed using the acrylic (called as the adhesive) 30 to form the multilayered high speed FLEX-PCB 32 having microstrip line type signal lines. The trench 22 can be opened inside the sheet material 26 by using the laser drilling or mechanical drilling. In the case of the laser drilling case, commercial available the Carbon-di-Oxide ($CO_2$) laser or Nd: YAG laser or Excimer laser or ultra-violet (UV) laser with optics arrangements can be used. The trench deepness (Hm/n in FIG. 5, where m and n are the integer and varies as 1, 2, 3, 4, . . . ) can be controlled by adjusting laser intensity and pulse width of the laser illumination. Adjusting the optics of the system can control the width. Siemens, Germany markets the UV and $CO_2$ lasers for microvia fabrication. The laser technology has been matured so much that today making via or microvia, it takes minimal time. Several companies such as Siemens, Germany, Electro Scientific Industries, Portland Oreg., USA etc. markets the instruments which can do fast microvia. For example, $CO_2$ Laser, marketed by Siemens, Germany, can make >20,000 number of vias per min having 75 to 200 μm diameter in conventional polyimide board. Most time is the off time (shifting time) from one via to other. According to this invention, similar laser drilling technology can be used to open the backside trench, which is the additional process necessary in the high speed FLEX-PCB buildup process. The time will be shorter for continuous drilling according to this invention.

According to this invention, as a conventional dielectrics, polyimide frequently used as the FLEX-PCB materials can be used. In this case, CO2 laser or YAG laser can be used for drilling to open the trench under the signal lines. According to this invention, it is estimated that 160 inch of length of line having 8 mil (~200 μm) size can be made by one minute, which turns to 9600 inches/hr. It estimated that for 4 layers of 12 inch×12 inch (30 cm×30 cm) FLEX-PCB having eight 12 inches MSL and eight 12 inches long strip lines. The approximated time to make the trenches using the laser drilling is only 1.2 minutes. Aligning can be done using infrared imaging analysis, which showed the metal pattern (signal lines) in the opposite side of the dielectrics.

According to this invention, alternatively, trench can also be opened using the wet (or dry)-etching after using standard photolithography. For example, the polyimide such as Q-PILON, marketed by Pi R&D Co, Ltd, Japan, can be used for High Speed Flex-PCB. Standard IC fabrication technology can be used.

Alternatively, another method of polymer removal to open the trenchm is using a milling machine. MITS Electronics, in Tokyo, Japan markets the milling machine, which can make the drill in dielectrics materials, manufactured for PCB. This machine has control in the X, Y, and Z direction. The z direction accuracy of this system is 0.1 mils. The instrument available in the market can make the drilling automatically based on the trace designed. Using the available drilling technology, the high speed FLEX-PCB can be fabricated as noted in this invention According to this invention, fabrication process for the microstrip line type signal lines are described. The similar fabrication process can be used for the high speed FLEX-PCB that has only single layer of the signal lines, which are the microstrip type configuration. Others layered can exist which may carry low speed signal lines. In that case, other layers could be fabricated using the uniform dielectrics as conventional FLEX-PCB fabricates. The high speed FLEX-PCB could be hybridly stacked, in which single or multiple layers could be dedicated using the non-uniform dielectrics (dielectrics with air trenches).

(ii) Process for Stripline Type Signal Lines

FIGS. 7A, 7B, 7C, 7D, 7E, and 7F are process steps for building the high speed FLEX-PCB with stripline type signal lines in accordance to the present invention, wherein like parts are indicated by like reference numerals, so that repeated explanation is omitted here. Enlarged cross-sectional views of a portion of high speed FLEX-PCB are only shown for explanation.

In the preferred embodiment, the process for the high-speed FLEX-PCB having striplines type signal lines consists of signal lines 16B formation in sheet material 34, opening the trenches 24B under the signal lines 16B, formation of the trenches 24A (aligned with signal lines 16B while stacked) in the sheet material 36 having uniform metal layer which acts as the ground 18, and stacking of the sheet material 36 with trenches 24A and uniform metal layer 18, sheet material 34 with trenches 24B and signal lines 16A, and third sheet material 38 with uniform metal layer 18 and uniform core layer, with the help of the two adhesive layers 40, to form the multilayered high speed FLEX-PCB 42. The stacking can be performed using the acrylic (called as the adhesive) 40 to form the multilayered high speed FLEX-PCB 42 having stripline type signal lines. The related process techniques for example the patterning, trenches opening technique etc. are already explained in FIG. 6, so that repeated explanation is omitted here.

Figure 2:
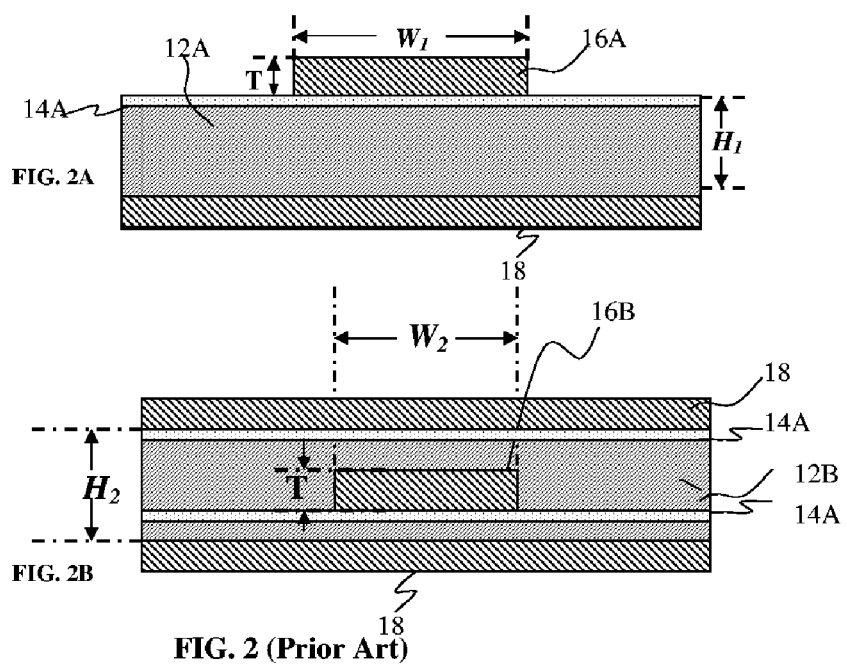
FIGS. 2A and 2B are the cross-sectional views' showing prior art of electrical signal lines used in FLEX-PCB for inter-chip (off-chip) connection.
Figure 3:
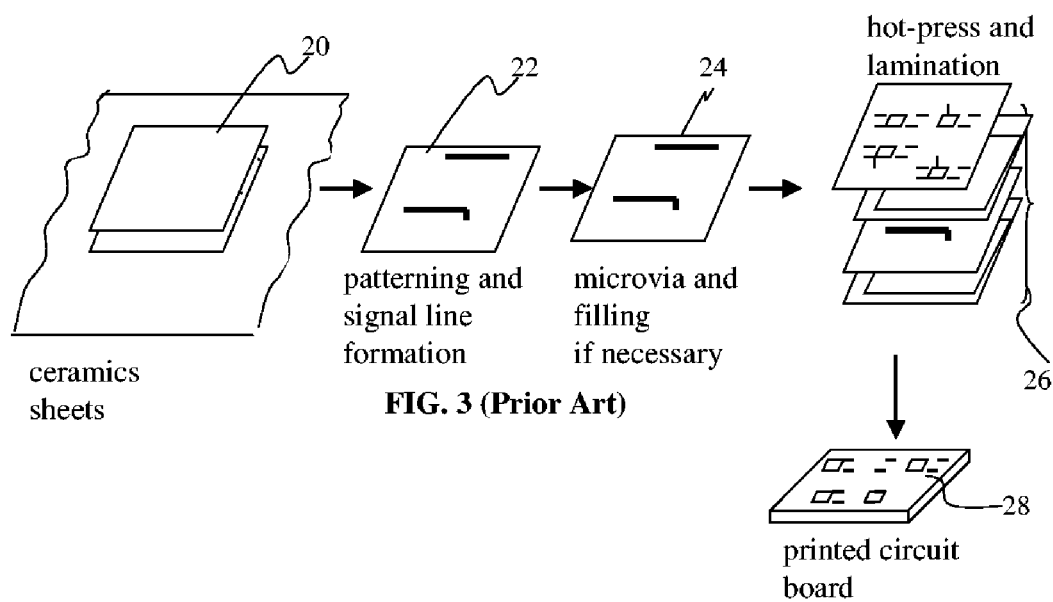
FIG. 3 is the schematics illustrating the prior art fabrication process of the FLEX-PCB.

According to this invention, fabrication process for the FLEX-PCB with only stripline type signal lines are described. The similar fabrication process can be used for the high speed FLEX-PCB that has single or multiple layers of signal lines, which are the stripline type configuration. Others layers may carry low speed signal lines, which may consists of uniform dielectrics as described in the Prior Art (FIG. 1 and FIG. 2). The high speed FLEX-PCB could be hybridly stacked, in which single or multiple layers could be dedicated using the non-uniform dielectrics (dielectrics with air trenches).

(iii) Process for Multi-Layered High Speed FLEX-PCB

Figure 6:
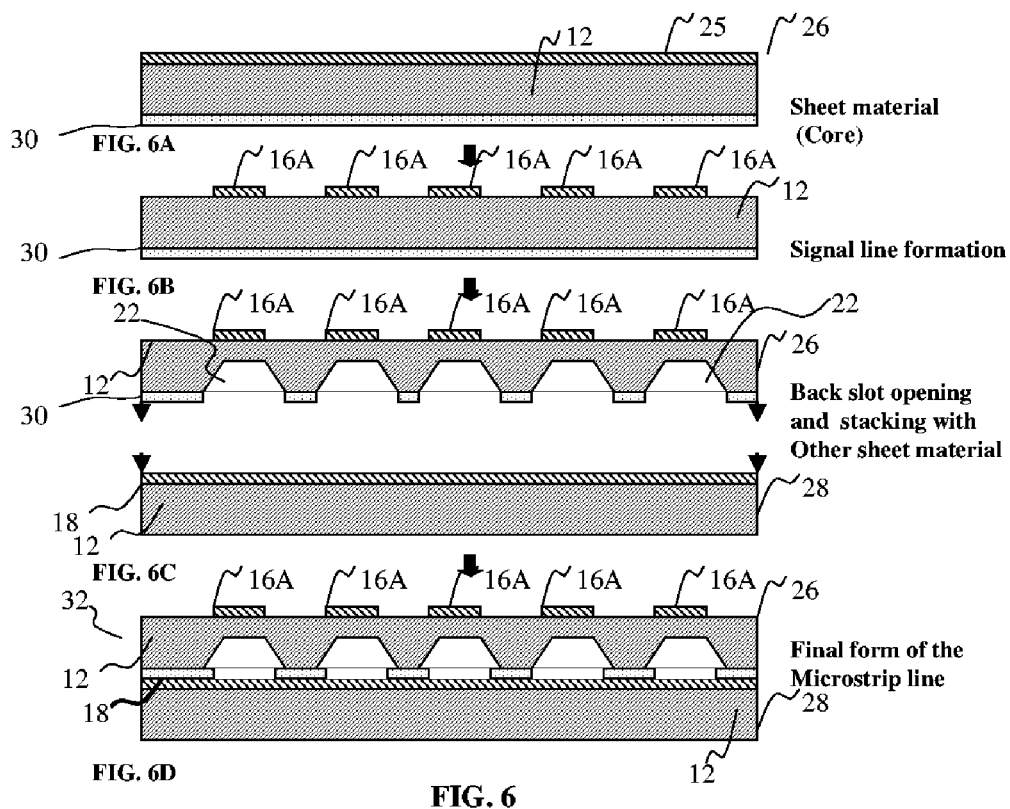
FIG. 6 is the schematics illustrating the fabrication process of the signal line of microstripline configuration used in the high speed FLEX-PCB in according to this invention.
Figure 7:
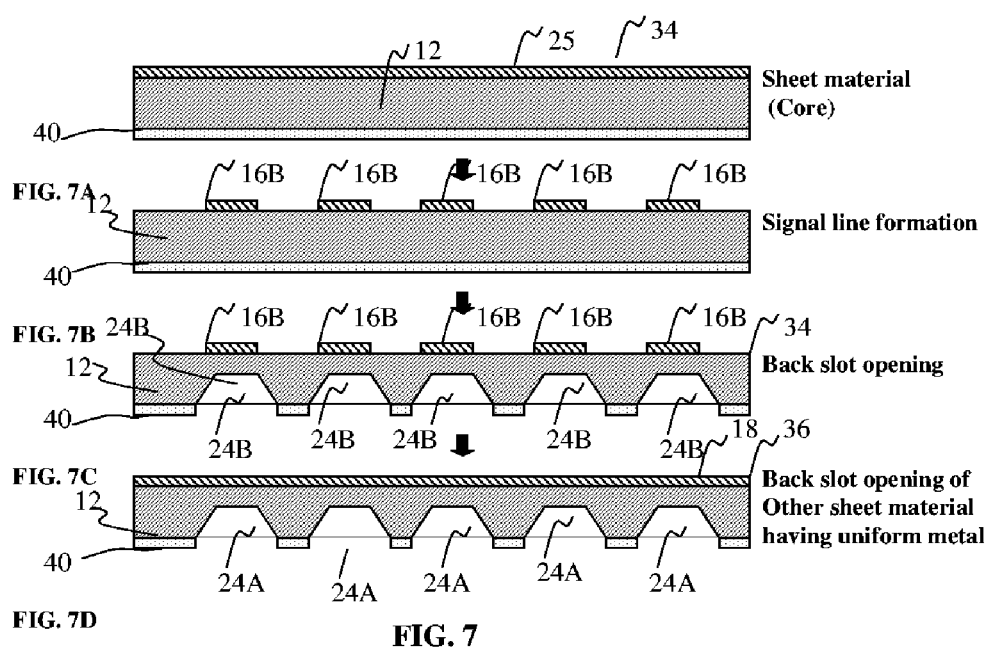
FIG. 7 is the schematics illustrating the fabrication process of the signal line of stripline configuration used in the high speed FLEX-PCB in according to this invention.
Figure 7:
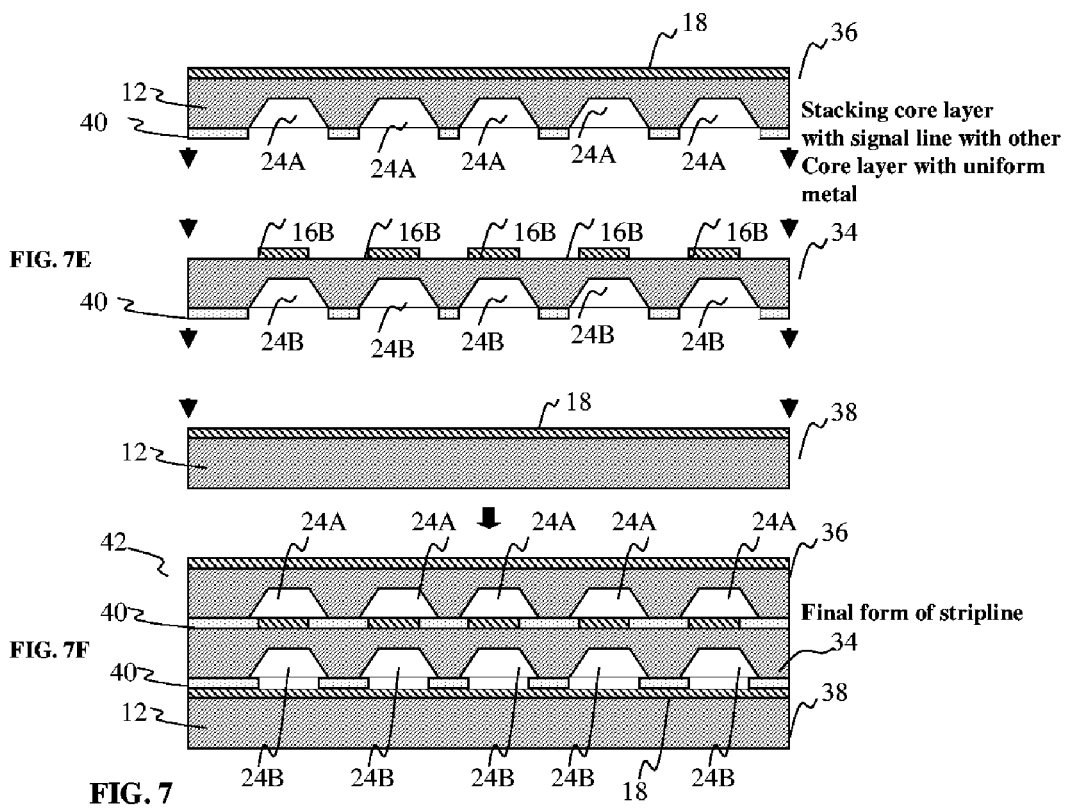

In the preferred embodiment as explained below, it is an object to use the techniques as explained in FIGS. 6 to 7, in the off-chip interconnects for multiple chip interconnection on the FLEX-PCB (board). The board here considered is the board made from Polyimide material or any other kind of dielectric material as mentioned previously. Similar technique can be applicable for other dielectric material board as explained earlier.

Figure 8:
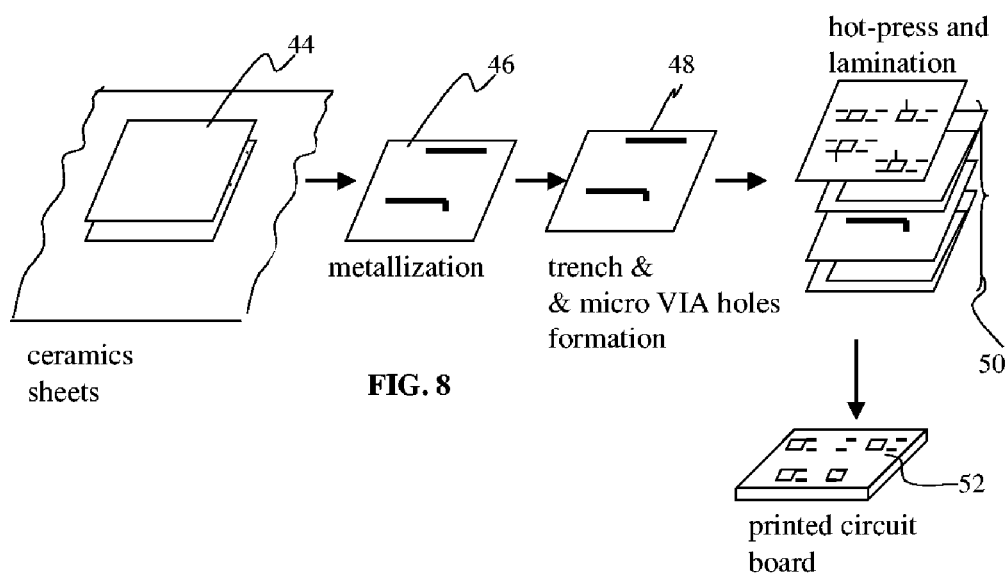
FIG. 8 is the schematics illustrating the fabrication process of the high speed multilayered FLEX-PCB embedding with high speed signals, in according to this invention.

FIG. 8 shows the flow-chart of the high speed multilayered FLEX-PCB fabrication process for the off-chip interconnects in accordance to the invention, where in the like parts are indicated by the like numerals, so that repeated explanation is omitted here. The dielectric sheet (not shown) is made using the standard FLEX-PCB technology for example using the slurry casting process. The slurry is cast into about 200 μm to 500 μm thick ceramic sheets by slip cast process. Each dielectrics sheet material 44 is the conventional FLEX-PCB core layer 44. Metallization sheet 46 is made using the conventional FLEX-PCB technology. After the metallization, the trench or slot is opened in sheet 48 by using the processes such as laser drilling, or dry-etching or wet-etching (following patterning for etching) or mechanical drilling. Via holes are formed through the dielectric sheet 44 by a punching machine with punches and dies. A ceramic sheet 44 may have more than 10,000 via holes in a 250 μm square area. Low resistivity conductor paste onto the punch sheet. In this process, via holes are filled with the paste to form the contacts between the signal lines. Low electrical resistivity material such as silver-palladium, and gold instead of molybdenum or tungsten refractory material can be used. The sheets are sintered at high temperature, which makes lower electrical resistivity. The trenched sheets 48 are precisely stacked in a pressing die in sequence by the stacking machine. These sheets 50 are laminated together by hot press. Density heterogeneities in the laminated samples influence any shrinkage in the sintered substrate. Therefore, this lamination process is homogenously carried out by means of the correct dimensional die and punch with flat surfaces. Burn out and sintering process for the multilayered FLEX-PCB board 52, may necessary after lamination at the temperature suitable to ceramic material used as the sheet. Additional via holes process (not shown) are necessary to connect the signal lines located in different layers.

(iv) Via or Micro-Via Structure in High Speed FLEX-PCB

In the preferred embodiment as explained below, it is an object to provide the technique to design the via or micro-via in the high speed FLEX-PCB, explained in FIGS. 6 to 8. This is one of the techniques, can be used for the case of the high speed FLEX-PCB with high-speed signal lines where opened trenches are used to reduce the effective dielectric constant and also to reduce effective tangent loss of the interconnects system. Any kinds of the board materials such as Polyimide and other kind of the dielectric material as mentioned previously can be used as the FLEX-PCB material.

FIG. 9 shows the schematic showing the enlarged cross-sectional view of a multilayered high speed FLEX-PCB with the high speed signal lines and micro-via embedded into the FLEX-PCB in accordance to the invention, where in the like parts are indicated by the like numerals, so that repeated explanation is omitted here. According to this invention, via or micro-via 54 can be formed without damaging a board 56 and to have sidewalls to deposit copper. To form the via or micro-via 54, the air-cavities (opened trenches) 24A and 24B are needed to stopped at some reasonable distance of l (shown in FIG. 9) which is dependent on the design rule tolerant. The signal line connecting to the via or micro-via 54 consists of two sections, (i) signal line 58 with opened trenches and (ii) signal line 60 without opened trenches prior to the via or microvia 54. The impedance of the signal lines 58 and 60 are maintained at the desired impedance by modifying the strip line width (not shown in FIG. 9). In this case, as the signal line 60 having the distance of l has the continuous dielectrics, for the fixed characteristic impedance (for example 50 ohm) the metal (signal line) width is adjusted to be narrower than the metal (signal line) width of signal lines 58 with opened trenches. The signal lines 58 and 60 located on core layer 12D are connected to core layer 12B through the ground layer 18C which is etched back before being stacked. According to this invention, the via 54 is drilled or laser out or etched after core 12A, core 12B, core 12C and core 12D are stacked. After the via is cut, copper is deposited forming the connection of two signal lines located in two core layers 12D and 1B. Then core layer 12E is stacked with interconnect defined to overlap and connect to the via.

FIGS. 10 and 10B show the schematic showing the enlarged top views of the signal line layout which is connecting to the via or microvia in the case of multilayered high speed FLEX-PCB with the high speed signal lines and microvia embedded into the FLEX-PCB, in accordance to the invention, where in the like parts are indicated by the like numerals, so that repeated explanation is omitted here. According to this invention, signal lines consisting of signal lines 58 and 60 (located on the surface 62) may have transition. The transition of the signal lines 58 with underneath air-cavities (opened trenches) 24 (24A and 24B) to the signal lines 60 without air-cavities (opened trenches) prior to the via 54. For smooth transition without reflection of the signal, the transition length $l_3$ is used. The shape of the transition could be trapezoidal or circular or ellipsoidal (not shown).

Figure 11:
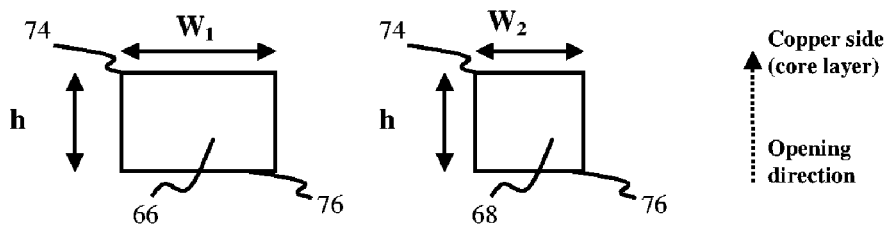
FIG. 11 is the schematics illustrating the structure of the opened trenches under the signal lines used in the high speed FLEX-PCB, in according to this invention.
Figure 11:
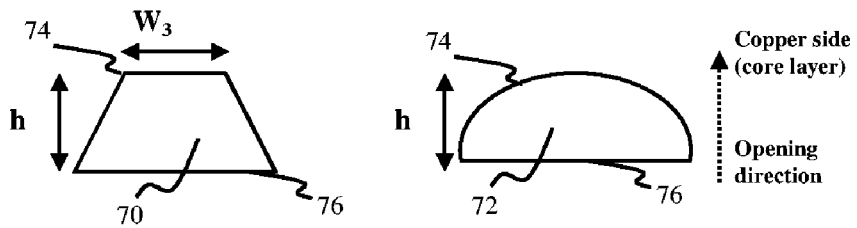

FIGS. 11A, 11B, 11C, and 10D show the schematic showing the shape of the opening trenches into the core layers pf the high speed FLEX-PCB in accordance to the invention, where in the like parts are indicated by the like numerals, so that repeated explanation is omitted here. According to preferred embodiment, the opening can be square shape 66, rectangular shape 68, trapezoidal shape 70, or circular shape 72 or ellipsoidal shape (not shown) where the top openings 74 can be wider or similar to bottom opening 76. Noted here that the top opening 74 closer to the metal line (signal line or ground) than the bottom opening 76. The widths $w_1$, $w_2$, and $w_3$ of the top openings 74 can be same or wider than the bottom openings 76. The widths $w_1$, $w_2$, and $w_3$ as shown in FIGS. 11A, 11B, and 11C could be smaller, same or larger than the signal lines width (not shown). In the case of the ellipsoidal or circular shaped openings 72, the width of the bottom openings can be smaller, same or larger than the signal lines width (not shown). The height (or deepness) of the openings can be adjusted based on the bandwidth requirements of the interconnects.

In the preferred embodiment as explained below, it is an object to provide some calculated data for the high speed interconnects, explained in FIGS. 12 to 14. These are the explanatory graphs showing the advantages of the techniques. For each of the calculation as a FLEX-PCB material, polyimide is used to show the performance improvement. As mentioned earlier, this invention covers also all kinds of flexible dielectrics materials having dielectric properties and can be used as the board material.

Figure 12A:
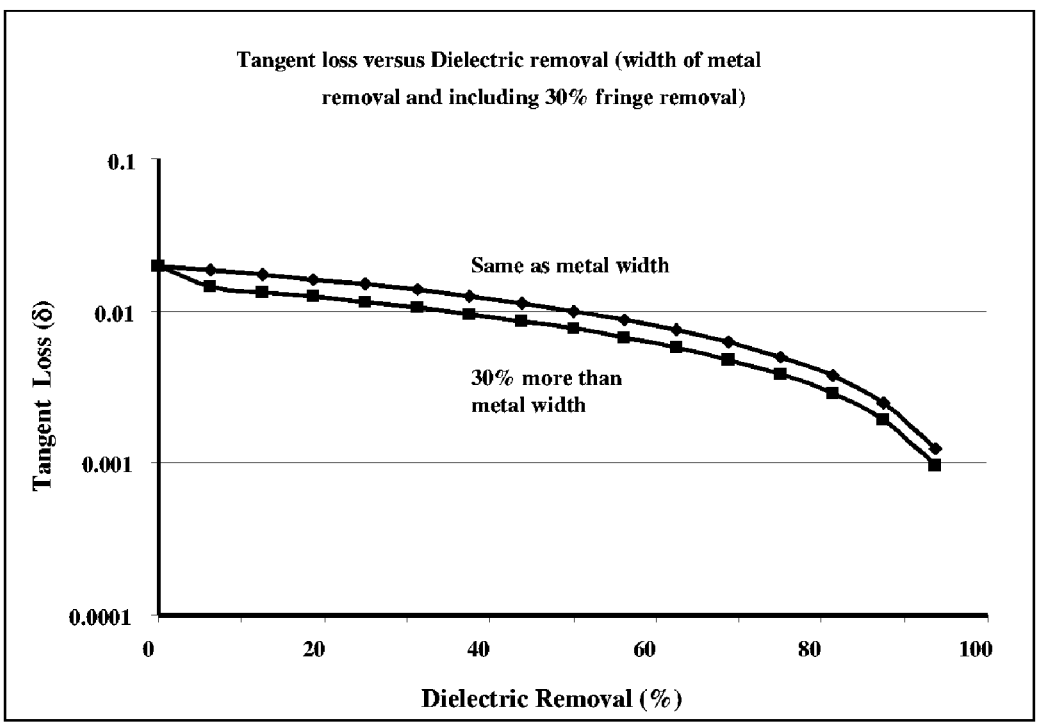
FIG. 12 is the graph showing the variation of the dielectric constant and dielectric loss as a function of the dielectric removal for trench opening, in according to this invention. This is an explanatory diagram to show the advantage of this invention. In this calculation, Polyimide is considered as the FLEX-PCB's dielectric material, and also the width of the opening is considered to be the same as that of the signal line.
Figure 12B:
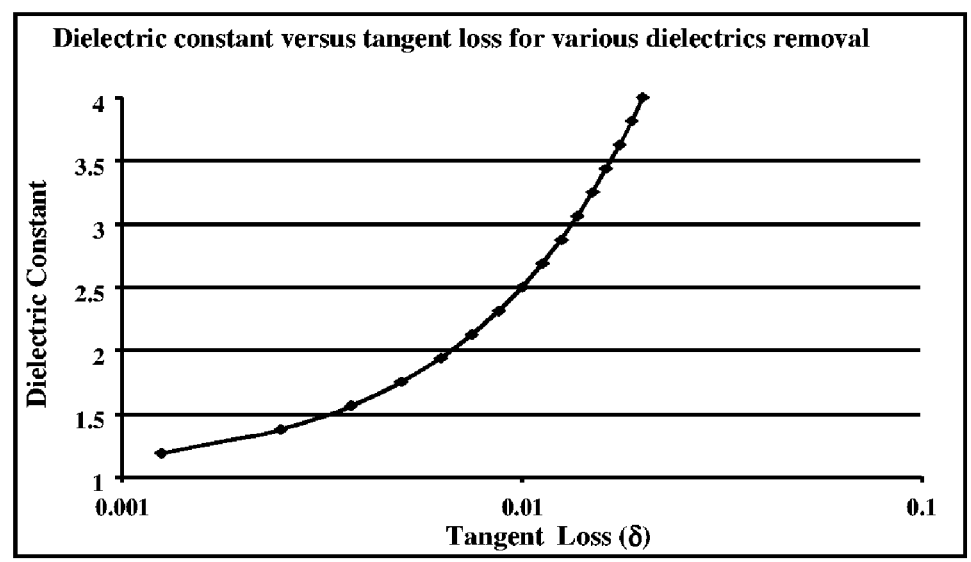
Figure 12C:
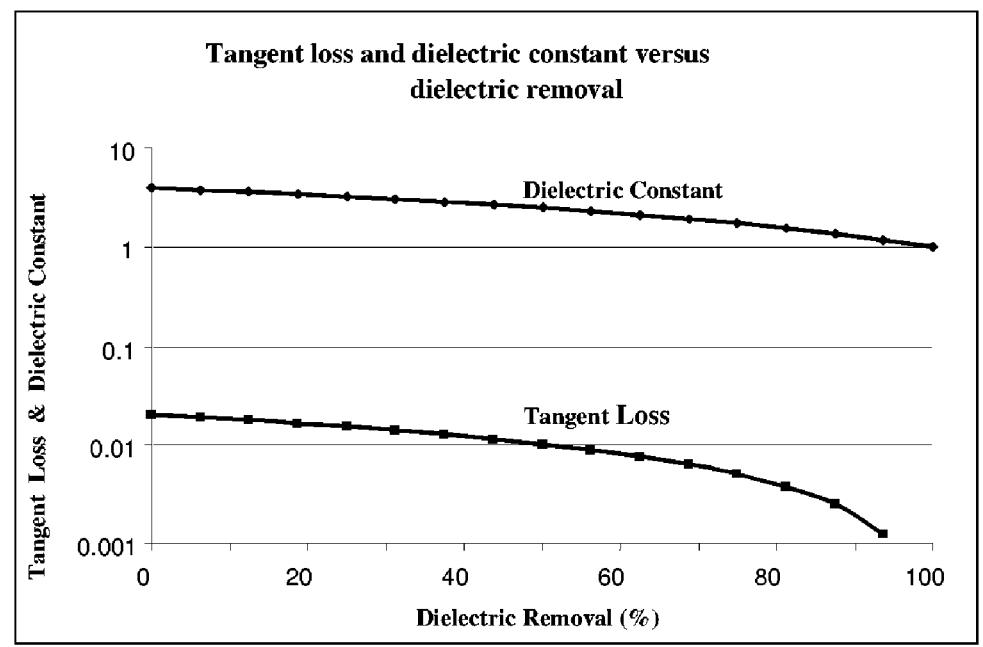

FIGS. 12A, 12B, and 12C show the estimated results for variation of the tangent loss and dielectric constant as the function of the dielectric removal for the interconnects with opened trenches, in accordance to the invention. Noted here that all the estimated results are for the conventional FLEX-PCB materials for example polyimide or the dielectrics having the dielectric constant and tangent loss (dielectric loss) of 4.0 and 0.02, respectively. The variation of the dielectric constant and tangent loss from 4.0 and 0.02, respectively are due to the dielectric removal. The estimated dielectric constant and dielectric loss are closer to the effective dielectric constant and dielectric loss for the interconnects with dielectric removals to open the trench. The effective dielectric constant and effective dielectric loss for all dielectric removal (100%) are thought to be equivalent to 1.0 and 0.0, respectively. In the estimation, if not mentioned, the dielectrics removal width is considered as the same as that of the signal line (metal) width. If the width of the trenches is made wider than the signal line width, the less removal is necessary for the achieved effective dielectric constant and effective tangent loss.

Figure 13A:
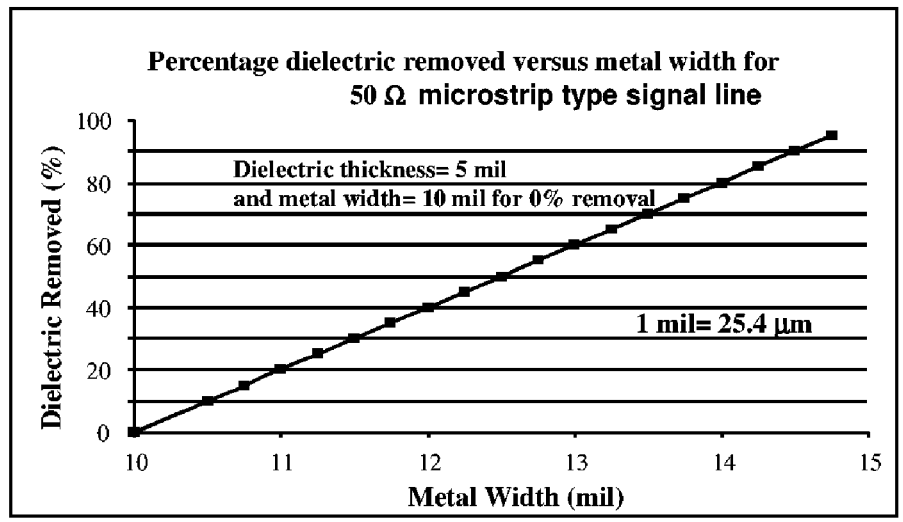
FIGS. 13A and 13B are the graphs showing the variation of the dielectric constant as function of the signal line width with various dielectrics layers thickness as the parameters, in according to this invention. This is an explanatory diagram for the microstrip type signal lines, to show the advantage of this invention. Design can be performed in various ways to get the maximum benefits of these inventions. In this calculation, Polyimide is considered as the FLEX-PCB's dielectric material, and also the width of the opening is considered to be the same as that of the signal line.
Figure 13B:
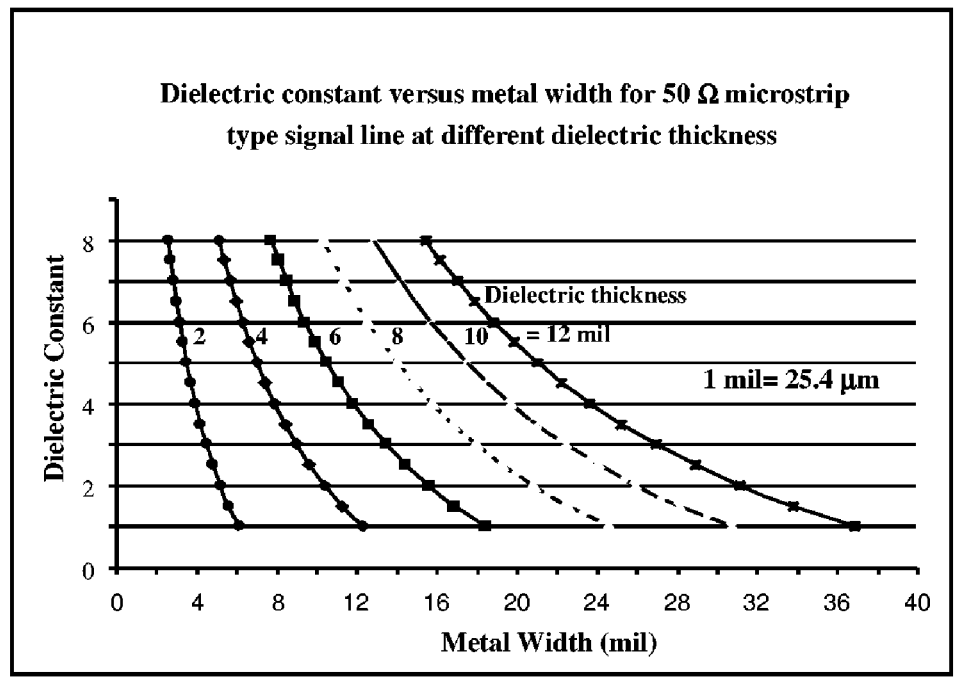
Figure 14A:
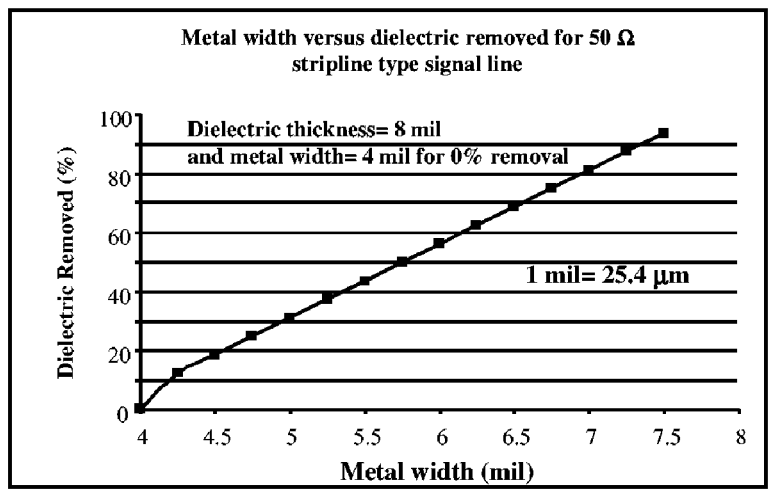
FIGS. 14A and 14B are the graphs showing the variation of the dielectric constant as function of the signal line width with various dielectrics layers thickness as the parameters, in according to this invention. This is an explanatory diagram for the stripline type signal lines, to show the advantage of this invention. Design can be performed in various ways to get the maximum benefits of these inventions. In this calculation, Polyimide is considered as the FLEX-PCB's dielectric material, and also the width of the opening is considered to be the same as that of the signal line.
Figure 14B:
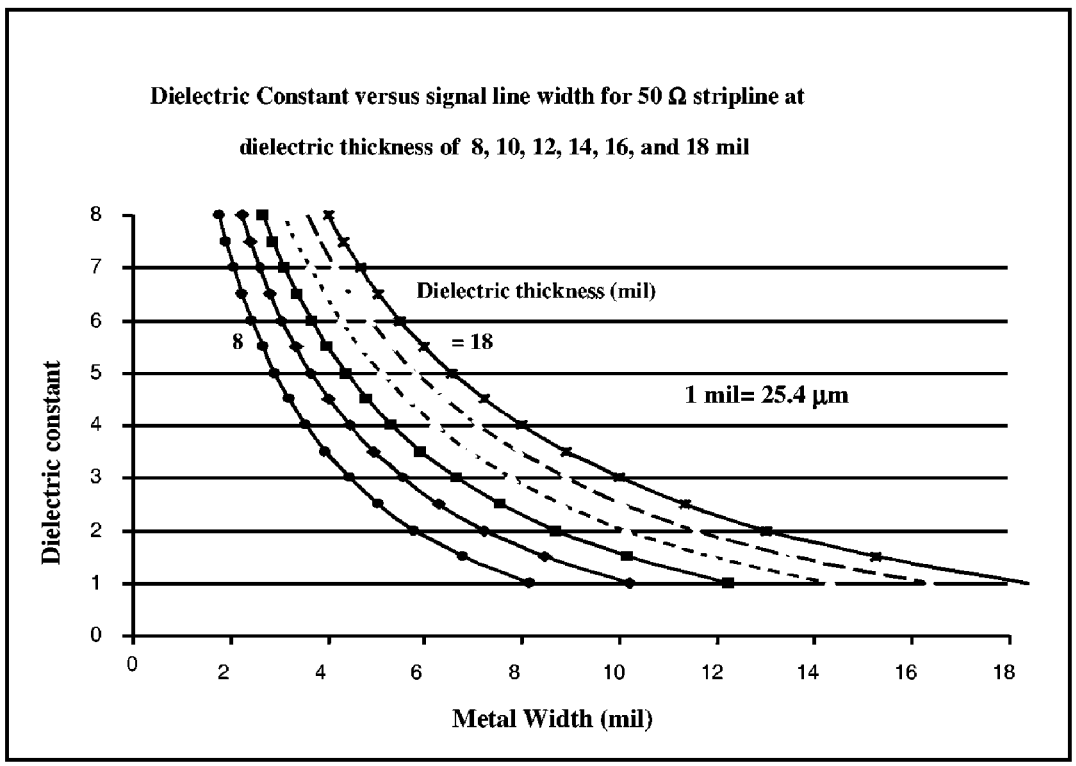

FIGS. 13A and 13B, and FIGS. 14A and 14B show the estimated results for variation of the tangent loss and dielectric constant as the function of the dielectric removal for the interconnects having opened trenches in accordance to the invention. The results as shown in FIGS. 13 and 14 are for the conventional FLEX-PCB material for example, Polyimide and also for the assumption as already explained in FIG. 12, so that repeated explanation is omitted here. According to this invention, as the effective dielectric constant is reduced, it is necessary to design/adjust the metal (signal line) width to keep characteristics impedance fixed. The signal line width is needed to keep wider than that of the signal line with no dielectric removal. FIGS. 13A and 14A are the metal width variation as the function of the dielectrics removal for the microstrip type and stripline type signal lines, respectively. 0.0% dielectric removal indicates the conventional type interconnects without opened trenches. 100% dielectric removal indicates the signal lines with out dielectrics and effective dielectric constant and effective dielectric loss are 1.0 and 0.0, respectively. FIGS. 13B and 14B are estimated results showing the dielectric constant versus signal line width with the dielectrics thickness are the parameters for the microstrip type and stripline type signal lines, respectively. All the results shown here are for the interconnects with 50 ohm characteristics impedance. As depicted, to keep characteristics impedance fixed for example 50 ohm, either signal line width is needed to design wider or the thickness of dielectrics is needed to be thinner than the interconnects without opened trenches.

Figure 15:
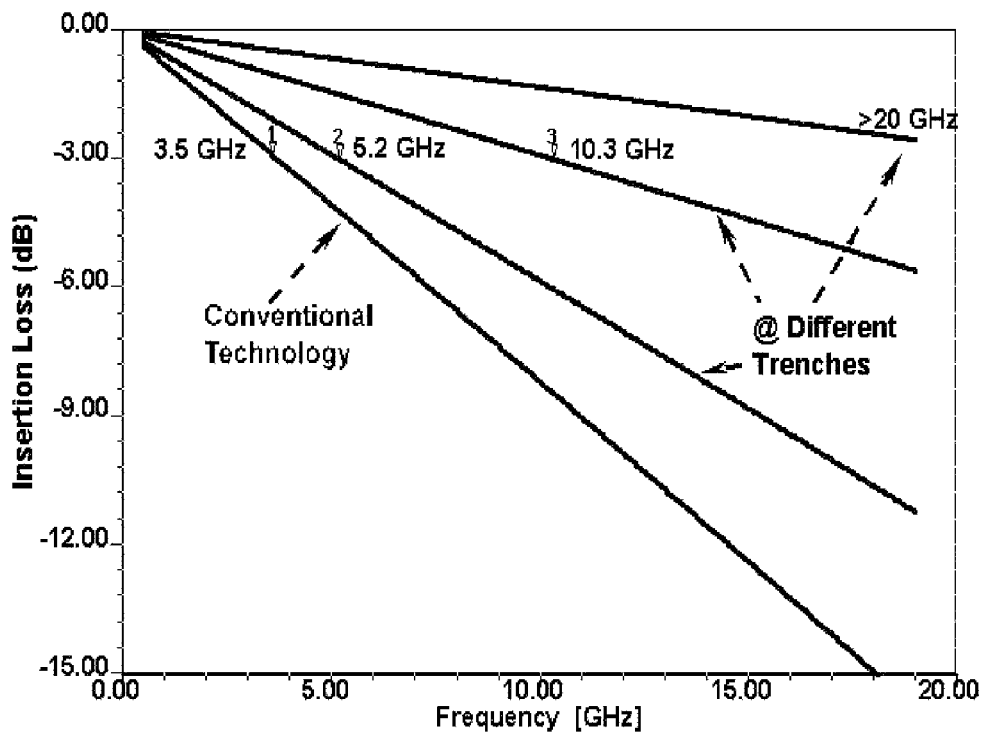
FIG. 15 is the graphs showing the bandwidth of the interconnects for various percentage of the dielectrics removal under the signal lines, in according to this invention. This is an explanatory diagram to show the advantage of this invention. Design can be performed in various ways to get the maximum benefits of these inventions. In this calculation, Polyimide is considered as the FLEX-PCB's dielectric material, and also the width of the opening is considered to be the same as that of the signal line. FLEX-PCB with 30 cm in length is also considered in the calculation.

FIG. 15 compares the frequency responses of the preferred embodiment in according to the invention. As explained in FIGS. 12 to 14, all estimated results are for the Polyimide materials, as the conventional FLEX-PCB material. Similar approach covers also other dielectric materials, which could be used as the FLEX-PCB material. According to this invention, the interconnects can be designed with controlled bandwidth by removing the appropriate dielectrics from the interconnects. As depicted, based on the percentage of the dielectric removal, the bandwidth can be increased to 20 GHz and above.

FIG. 16A is the top view and FIGS. 16B and 16C are cross-sectional views along AA' and BB' directions of FIG. 16A in accordance with the present invention wherein the like parts are indicated by the like numerals, so that similar explanations are omitted here. In the preferred embodiment, two chips interconnection on the FLEX-PCB 77 are shown. As an example, processor 120 and memory 130 interconnection on FLEX-PCB 77 are shown as an example, and it comprises with high-speed signal lines 78, core layers 80, adhesive to stack the several core layers 82, and the ground (power line) 84. The core layers have the opened trenches 86, based on whether they carry the high-speed signal lines. The high speed signal line 78 can be taken from the top of the FLEX-PCB layer and lower speed signal line can be brought to the lower layer. This would reduce the possibility any discontinuities, which may arise due to the vias. Bandwidth of the interconnects using the technique as mentioned previously, can be attained and thereby on-chip's signal speed can be preserved. For simplicity in drawing, enlarge portion of cross-sectional views for high speed (e.g. processor and memory) chips portion interconnects are only shown. Complete FLEX-PCB portion with considering lower speed chip interconnects are not shown.

Figure 16:
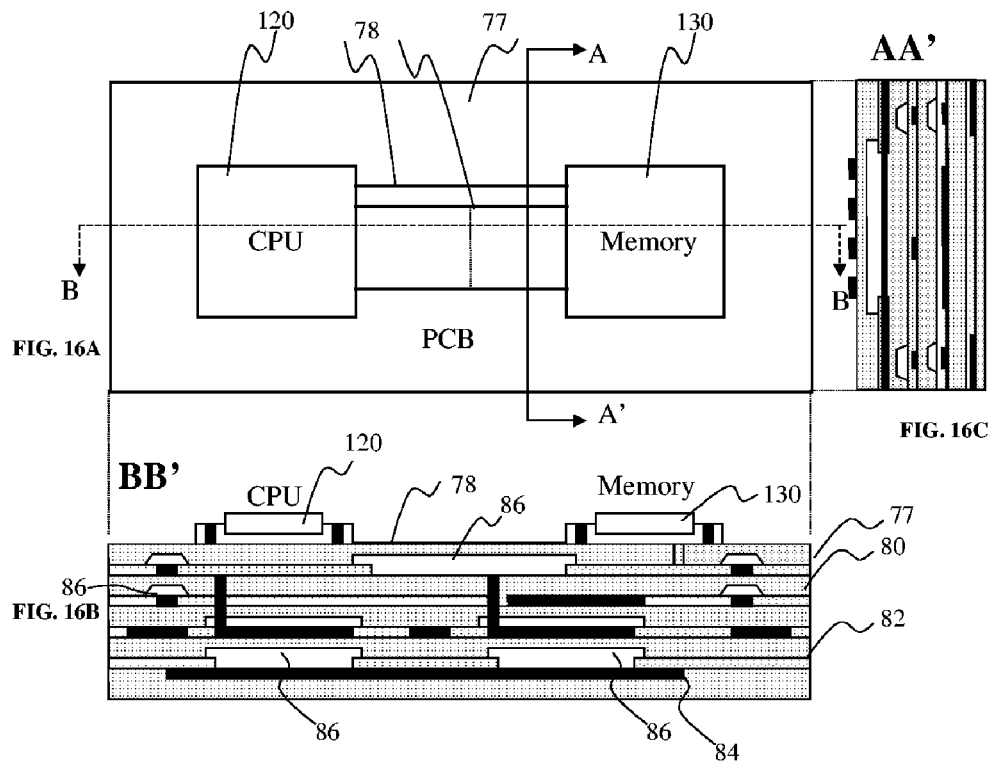
FIG. 16A is the top view and 16B and 16C are the side and front cross-sectional views along AA' and BB' direction of FIG. 16A, illustrating the interchip (off-chip) interconnections consisting of the multilayered high speed FLEX-PCB in according to the present invention.
Figure 17:
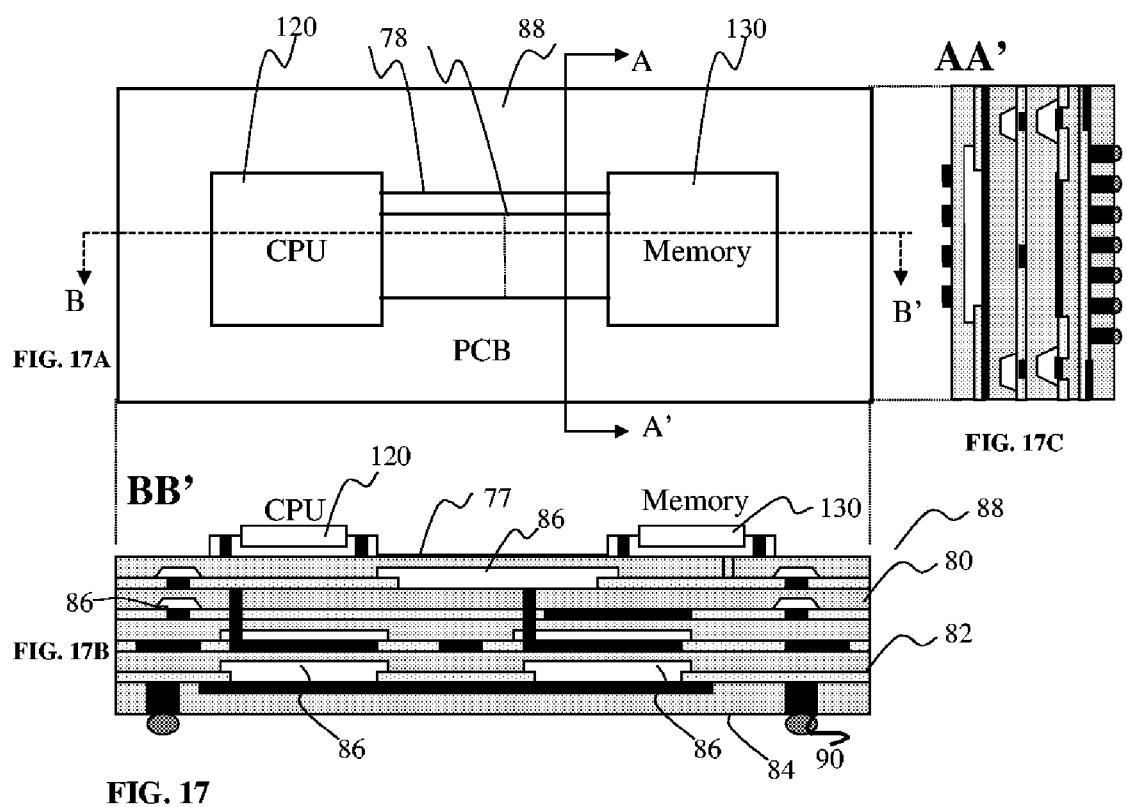
FIG. 17A is the top-view and 17B and 17C are the side and front cross-sectional views along AA' and BB' directions of FIG. 17A, illustrating mountable/stackable the interchip (off-chip) interconnections consisting of the multilayered high speed FLEX-PCB in according to the present invention.

FIG. 17A is the top view and FIGS. 17B and 17C are enlarged cross-sectional views along AA' and BB' directions of FIG. 17A in accordance with the present invention wherein the like parts are indicated by the like numerals as used in FIGS. 4 and 16, so that similar explanations are omitted here. In the preferred embodiment, two chips interconnection are shown. In the preferred embodiments, alternatively, the high-speed chips interconnect in the separate board 88, act as the for multi-chip-module. For example for connecting the processor and memory, board with back-trench or slot can be used and they can be fabricated using the process along with the design as explained in FIGS. 6 to 10. Each board has the pins 90 coming out from the outside of the FLEX-PCB board 88 which can be mountable on to the motherboard made from the conventional FLEX-PCB materials for more integration and for ground/power and low speed connections.

The dielectric materials include all kinds of ceramic materials such as Duroid, PTFE, AlN, $Al_2O_3$, Mullite ($3Al_2O_3$:$2SiO_2$), SiC, $SiO_2$, Silcion nitride, Silicon-Oxy-Nitride, BeO, Cordie-rite (magnesium alumina silicate), BN, Glass (with different compositions), polyamide, epoxy glass, CaO, MnO, ZrO2, PbO, alkali-halide (e.g. NaBr, NaCl) etc.) etc., and all kinds of the polyimides and benzocyclobutenes (BCBs) having dielectric properties. Polymer dielectric material also includes, but not limited to, Teflon, liquid crystal polymer, epoxy, parylene, silicone-polyimide, silicone-gel, and fluorinated ethylene propylene copolymer. It also includes materials of elastomers (e.g. silicone elastomer), monomers, and gels. All standard polymers can be available from the standard manufacturer for example, Du-pont, Nelco, General Electric, Isola, Hitachi-Chemical, Mitsui, and Mitsubishi-Chemical Industries. Gore-Tex, Japan, markets liquid crystal polymer.

According to this invention, flow or no-flow type adhesive can be used for stacking the multiple core layers with signal or ground lines. It is highly desirable to use thinner adhesive in order to get maximum performances advantages. For adhesive materials, conventional available adhesives, marketed Dupont, etc. can be used. The adhesives type could be flow or no-flow type based on the pressure and temperature of the process during the stacking the core layers. In order to avoid complete prevention of the adhesive from flowing into the trenches, no flow type adhesive can be used. By process optimization the trenches can be made to open as designed and the designed response can be made to as close to the experimental response.

In the preferred embodiments, details process condition has not been described. However, it would need to optimize the process condition to achieve the maximum performance. Absorption of the water during the process may occur. High temperature annealing may necessary before stacking to remove the water molecules as absorbed during or after the process. The water resistant-coating can be used on the trench surface after trench opened (and before stacking) to prevent the water or gas absorption during the process, which may reduce the reliability.

In the preferred embodiments as explained in FIGS. 12 to 15, only the Polyimide based FLEX-PCB design parameters are shown as an example. These results has been shown in an intention to show the design ways for the interconnects according to this invention. Optimized design parameters may needed based on the materials parameters and interconnects structure and these can be achieved using the three-dimensional (3-D) field solution. For other dielectrics based FLEX-PCB (whether rigid or flex) similar design ways can be used for achieving the maximum performance.

In the preferred embodiments as explained in FIGS. 4 to 17, each core dielectric (sheet material) consisting of the dielectric, adhesive and copper layer is considered for simplicity in explanation and drawings. This invention also covers the FLEX-PCB build-up made from the core consisting of the copper layer, dielectric and adhesive. In this case, the process is the same as explained earlier. Only difference is to open the back-trench which passes from polyimide (all portion) and dielectrics (percentage as necessary for bandwidth) (not shown here). For adhesive materials, conventional available adhesive, marketed by Dupont. etc. can be used. The adhesive type could be flow or no-flow type based on the pressure and temperature of the process during the stacking the core layers. In order to avoid complete prevention of the adhesive from flowing into the trenches, no flow type adhesive can be used. By process optimization the trenches can be made to open as designed and the designed response can be made to as close to the experimental response.

In the preferred embodiments as explained in FIGS. 4 to 17, only strip line and microstrip line configurations are considered. However, in accordance with the present invention, other signal lines, not mentioned here, such as coplanar line configuration with single or multiple signal lines (as single or differential) also include. Dielectric coverage (not shown) using of the same or different dielectric material can also be used.

In the preferred embodiments as explained in FIGS. 4 to 17, the ground plan is located close proximity to the prepreg and the opened trench (in the case of the strip-type and microstrip type lines). This invention can also covered for the ground plan not located under (and over) the trench openings. The ground plan can be located both sides of the opened-trenches.

According to this present invention, alternatively. The ground plan can be located both vertical sides of the opened-trenches to reduce the interference.

The present invention has been described above by way of its embodiments. However, those skilled in the art can reach various changes and modifications within the scope of the idea of the present invention. Therefore it is to be understood that those changes and modifications also belong to the range of this invention. For example, the present invention can be variously changed without departing from the gist of the invention, as indicated below.

According to the present invention, it is the object to provide the high speed FLEX-PCB with interconnects having the opened trenches for reducing the microwave loss for increasing the bandwidth of the interconnects. It is also the object to use any dielectric material (including conventional dielectric material and the manufacturing technology) in the technique and could increase the bandwidth tremendously. In simplicity of drawing, preferred embodiments are described mostly considering the microstrip line and strip line configurations. However, all line configurations such as coplanar line with single or multiple signal line (including differential line) also cover this invention.

According to the present invention, high speed FLEX-PCB with interconnect system uses inhomogeneous dielectric system consisting of the dielectrics and the portion of air layer to reduce the effective dielectric loss and dielectric constant, wherein the inhomogeneous dielectric system has two or more dielectrics, and one of them dielectrics has lower dielectric loss and dielectric constant. In the preferred embodiment, opened trench with air is used in the high speed FLEX-PCB. Alternatively the low dielectric loss (and/or dielectric constant) material or the liquid crystal polymer fills up the trench.

According to this present invention, the dielectric and tangent loss variation are estimated based on the assumption that the field is accumulated under the signal lines, to show the advantages of the preferred embodiments and to make it easy in estimation. In fact, the electrical field is spread outside the signal line. More dielectric constant and dielectric loss variation are possible if the trench width is wider than the signal line-width, and they can be extended in both sides of the trench.

The present invention is described here, considering only onto the high-speed electrical signal. However, the present invention can be also used in the interconnects system where both electrical and optical signal can be transmitted using the same signal line. For example, the trench portion is used to reduce the effective dielectric loss and effective dielectric constant. By using the opened backside slot or opened trench the signal is mostly flowing through the trench filled up with air or lower dielectric loss material. In the interconnects where both high speed electrical signal and high speed optical signal are considered, the trench or backside slot used can be used for transmitting the optical and electrical signal together, and significant bandwidth of the interconnects system with high integration capability can be realized.

Several preferred embodiments for high-speed on-chip and off-chips interconnects are described considering the microstrip line configuration and also the dielectric system with back-trench or slot. All signal line configurations as mentioned earlier covers under this invention. The shape of the trench could be any type such as square, rectangular, circular, trapezoidal or any polynomial shape, or any shape convenient for manufacturing. These can be filled up by dielectric material having the lower dielectric constant than the dielectric substrate.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

The present invention is expected to be found practically use in the high-speed on-chip, off-chip interconnects, where the signal speed 5 Gb/s and beyond are necessary using of the conventional material, and the bandwidth of the interconnects can be made ideally to speed of the light for no-loss transmission line. The present invention can also be implemented in the high-speed single or multiple signal connectors, and high-speed cables (not shown). The applications include on-chip interconnects where high-speed electronics chips or electronics chips with optical chips are need to be connected. As ideally the bandwidth of the interconnect system can be made to close to fiber, future monolithic (and also hybrid near future) integration of electronics and optical chips can also interconnected without (much or none at all) sacrificing the chips speed. The application also includes the high speed multichip module interconnection, 3-D chip or memory interconnection, high speed parallel system for computer animation and graphics for high speed 2-D or 3-D video transmission, and high bandwidth image display, high speed router where high speed electronics switches (or IC) are needed to be interconnected. The application also include the high speed (5 Gb/s and beyond) connectors and cables for high speed board-to-board, rack-to-rack interconnection, and also single or multiple high-density signal connections and carrying from one side to other in longer path.

What is claimed is:

1. A multi-layered flex printed circuit board (Flex-PCB) comprising;
    at least one first dielectric layer having a first surface and an opposing second surface;
    at least one first electrical signal line located on said first surface of said at least one first dielectric layer;
    at least one first backside open trench located on said second surface of said at least one first dielectric layer, located under and aligned with said at least one first electrical signal line;
    at least one first adhesive layer located under said second surface of said at least one first dielectric layer;
    at least one second dielectric layer having a first surface and an opposing second surface;
    at least one first ground/power plane located on said first surface of said at least one second dielectric layer;
    at least one second backside open trench located on said second surface of said at least one second dielectric layer;

at least one second adhesive layer located under said second surface of said at least one second dielectric layer;

at least one third dielectric layer having a first surface and an opposing second surface;

at least one second electrical signal line located on said first surface of said at least one third dielectric layer, located under and aligned with said at least one second backside open trench;

at least one third backside open trench located on said second surface of said at least one third dielectric layer, located under and aligned with said at least one second electrical signal line;

at least one third adhesive layer located under second surface of said at least one third dielectric layer;

at least one fourth dielectric layer having a first surface and an opposing second surface;

and at least one second ground/power plane located on said first surface of said at least one fourth dielectric layer;

thereby forming a stacked arrangement of dielectric layers, wherein said at least one first dielectric layer is stacked above said at least one second dielectric layer, said at least one second dielectric layer is stacked above said at least one third dielectric layer, and said at least one third dielectric layer is stacked above said at least one fourth dielectric layer, and wherein said at least one first electrical signal line and said at least one first ground/power plane form at least one microstrip type transmission line, and wherein said at least one first ground/power plane, said at least one second electrical signal line, and said at least one second ground/power plane form at least one stripline type transmission line, and wherein the structure of said backside trenches is adapted to reduce effective dielectric constant and/or dielectric loss.

2. The printed circuit board according to claim 1, wherein the cross sectional shapes of the backside open trenches are selected from the group consisting of a circle, an ellipse, and a polygon having greater than 4 sides, convenient for manufacturing.

3. The printed circuit board according to claim 1 further comprising a dielectric layer having at least one ground/power line and at least one signal line on the same surface, thereby forming a coplanar type transmission line, wherein said microstrip type, stripline type, and coplanar type transmission lines are single-ended or differential-ended.

4. The printed circuit board as claimed in claim 3, wherein the coplanar type transmission line is exposed to either in dielectric media or in air media.

5. The printed circuit board as claimed in claim 1, wherein said fourth dielectric layer is homogeneous.

6. The printed circuit board as claimed in claim 1, wherein said fourth dielectric layer is homogeneous, and wherein said at least one second backside open trench and said at least one third backside open trench are further aligned with said at least one first electrical signal line.

7. The printed circuit board as claimed in claim 1, wherein the trenches are filled with a material of lower dielectric loss and/or lower dielectric constant than the dielectric layers.

8. The trench as claimed in claim 1 is filled up or coated by liquid crystal polymer to have tunability of the dielectric loss (or dielectric constant).

9. The printed circuit board according to claim 1, wherein at least one of the signal lines comprises:

at least one first section located on a portion of its respective dielectric layer having back side open trench; and at least one second section located on a portion of its respective dielectric layer having no back side open trench, wherein said at least one first section is wider than said at least one second section;

and wherein the printed circuit board comprises at least one via that connects at least two different layers of the printed circuit board connected to said second section.

10. The printed circuit board according to claim 9, further comprising a dielectric system having open trench located above the first at least one section of the first signal line.

11. The printed circuit board as claimed in claim 1, wherein the adhesive for stacking multiple dielectric layers is either no-flow or flow adhesive.

12. The printed circuit board as claimed in claim 1, wherein the adhesive layers comprise acrylic adhesive or epoxy adhesive.

13. The printed circuit board as claimed in claim 1, wherein the dielectric layers comprise epoxy glass composites, polymers including polyimide, resin, alumina, boron nitride, silicon oxide, aluminum nitride, low temperature or high temperature ceramics, silicon nitride, semiconductor, or PTFE.

14. The printed circuit board as claimed in claim 1, wherein the adhesive layers are continuous.

15. The printed circuit board as claimed in claim 1, wherein the adhesive layers are discontinuous, such that no adhesive exists in the opening of said trench.

16. The printed circuit board as claimed in claim 1, comprising a rigid circuit board.

17. The printed circuit board according to claim 1, wherein the trench is filled with coolant to cool the circuit board.

18. The flex printed circuit according to claim 1, comprising n-number of first dielectric layers, n-number of second dielectric layers, n-number of third dielectric layers, and n-number of fourth dielectric layers, wherein n is an integer greater than 1, alternately arranged to build the multilayer printed circuit board.

19. The printed circuit board according to claim 1, further comprising:

at least two electronic elements, wherein said at least two electronic elements are connected by at least one of the signal lines, and at least one via connecting at least two of the layers.

20. The flex printed circuit according to claim 19, wherein at least one of the at least two electronic elements is selected from a group consisting of elements used in off-chip, cable, board-to-board, and rack-to-rack interconnect systems.

21. The flex printed circuit according to claim 19, wherein the signal line and the ground line are further alternatively arranged in n-number of layers building the multilayer flex printed circuit board connecting the at least two electronic elements.

22. The multilayer high-speed flexible printed circuit board in claim 19, further comprising at least one pad or bump for bonding.

23. The process for building the FLEX-PCB as claimed in claim 1, comprises;

patterning, etching to form electric signal line on first polymer;

opening back-trench in said first polymer;

cutting epoxy (adhesive), stacking polymer having said signal line and back-trench with second polymer layer having uniform metal plan in one side, using said adhesive;

wherein, said adhesive is located in between two said polymers.

24. The process for building of the FLEX-PCB as claimed in claim 1, with the stripline type and microstrip type signal lines, comprises;

formation of at least one signal line on at least one polymer substrate;

opening at least one back-trench in said polymer substrate carrying said signal line;

opening at least one back trench in polymer substrates having ground plane, required on-top of said signal line for the case of stripline type signal line, and;

stacking said polymer substrates with said signal lines or uniform ground plane by using adhesive in between two said polymer substrates;

wherein, the stripline configuration has at least two trench openings locating in said polymer dielectrics, close proximity to said signal line, and wherein microstrip line has one trench opening locating in back side of said polymer substrate.

* * * * *